(12) United States Patent
Iguchi et al.

(10) Patent No.: US 11,424,225 B2
(45) Date of Patent: Aug. 23, 2022

(54) IMAGE DISPLAY DEVICE

(71) Applicant: Sharp Fukuyama Laser Co., Ltd., Fukuyama (JP)

(72) Inventors: Katsuji Iguchi, Fukuyama (JP); Hidenori Kawanishi, Fukuyama (JP); Koji Takahashi, Fukuyama (JP); Masumi Maegawa, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 142 days.

(21) Appl. No.: 16/918,318

(22) Filed: Jul. 1, 2020

(65) Prior Publication Data

US 2021/0005583 A1   Jan. 7, 2021

(30) Foreign Application Priority Data

Jul. 4, 2019  (JP) .............................. JP2019-125201

(51) Int. Cl.
| | | |
|---|---|---|
| *H01L 25/075* | (2006.01) | |
| *H01L 27/12* | (2006.01) | |
| *H01L 33/50* | (2010.01) | |
| *H01L 33/58* | (2010.01) | |
| *H01L 33/60* | (2010.01) | |
| *H01L 25/04* | (2014.01) | |
| *H01L 51/50* | (2006.01) | |
| *H01L 51/52* | (2006.01) | |

(Continued)

(52) U.S. Cl.
CPC ........ *H01L 25/0753* (2013.01); *H01L 25/048* (2013.01); *H01L 27/1214* (2013.01); *H01L 33/50* (2013.01); *H01L 33/58* (2013.01); *H01L 33/60* (2013.01); *H01L 33/62* (2013.01); *H01L 51/502* (2013.01); *H01L 51/5271* (2013.01); *H01L 51/5275* (2013.01); *G02B 3/0056* (2013.01)

(58) Field of Classification Search
CPC ..... H01L 27/1214; H01L 33/50; H01L 33/60; H01L 51/502; H01L 51/5271; H01L 51/527

See application file for complete search history.

(56) References Cited

U.S. PATENT DOCUMENTS

| | | | |
|---|---|---|---|
| 7,071,905 B1 * | 7/2006 | Fan ..................... | G09G 3/3233 345/83 |
| 2008/0122341 A1 * | 5/2008 | Orita .................... | H01L 33/06 313/503 |

(Continued)

FOREIGN PATENT DOCUMENTS

| | | |
|---|---|---|
| CN | 102341740 A | 2/2012 |
| CN | 108493313 A | 9/2018 |
| JP | 2002-141492 A | 5/2002 |

*Primary Examiner* — Jay C Chang
*Assistant Examiner* — Mikka Liu
(74) *Attorney, Agent, or Firm* — ScienBiziP, P.C.

(57) ABSTRACT

An image display device includes: a plurality of micro light emitting elements arranged in an array shape; a driving circuit substrate including a driving circuit that supplies electric current to the plurality of micro light emitting elements and that causes the plurality of micro light emitting elements to emit light; a plurality of micro lenses in contact with light emitting surfaces of the plurality of micro light emitting elements; and a plurality of partition walls disposed around the plurality of micro lenses in a direction parallel to the light emitting surfaces.

19 Claims, 19 Drawing Sheets

(51) Int. Cl.
*H01L 33/62* (2010.01)
*G02B 3/00* (2006.01)

(56) References Cited

U.S. PATENT DOCUMENTS

2010/0321640 A1    12/2010  Yeh et al.
2011/0297975 A1    12/2011  Yeh et al.
2011/0299044 A1    12/2011  Yeh et al.
2012/0243261 A1     9/2012  Yamamoto et al.
2017/0062674 A1*    3/2017  Kwon .................... H01L 33/60

* cited by examiner

FIG.4
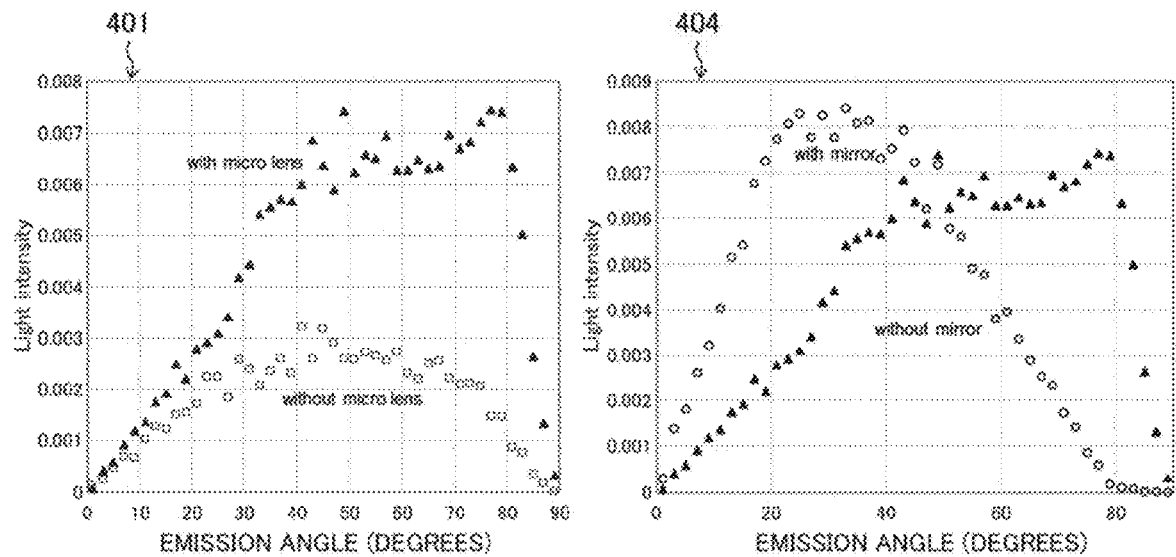
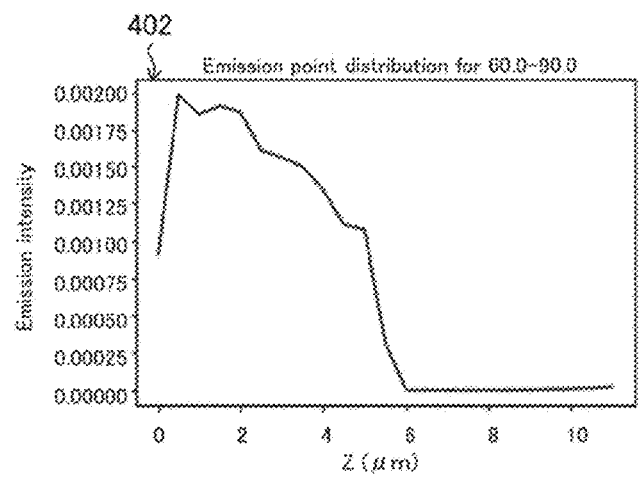
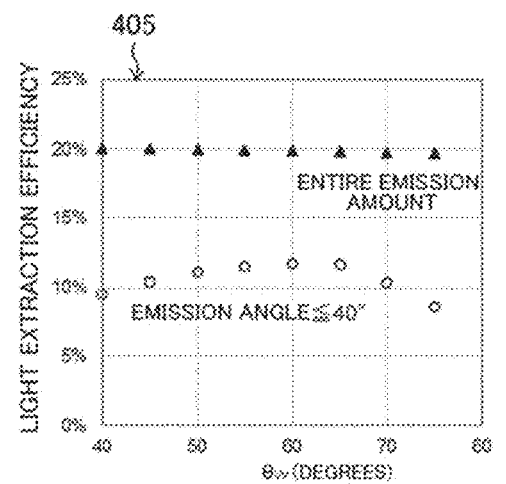
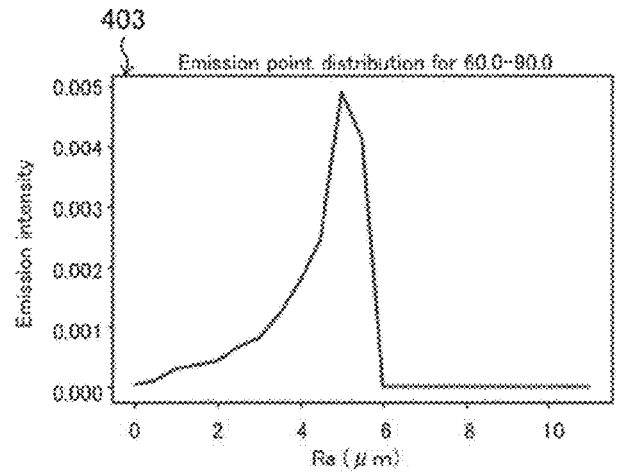
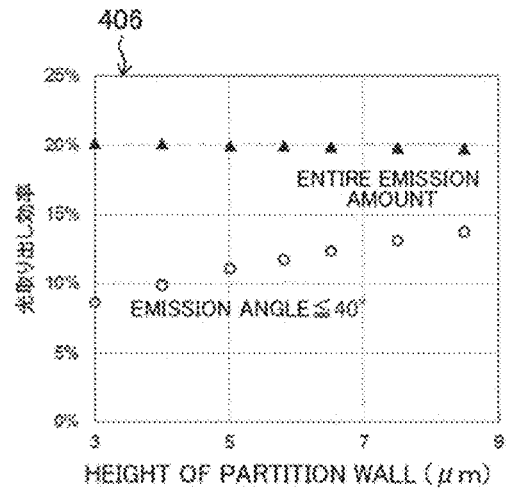

34c: Partition wall
34Sc: Reflection surface
35: Partition wall body
36: Partition wall reflector
37: Opening
40: Micro lens
50: Driving circuit substrate
51: P-drive electrode
52: N-drive electrode
60: Embedding material
100: Micro light emitting element
101: Light emitting surface of micro light emitting element
200c: Image display device

FIG.11

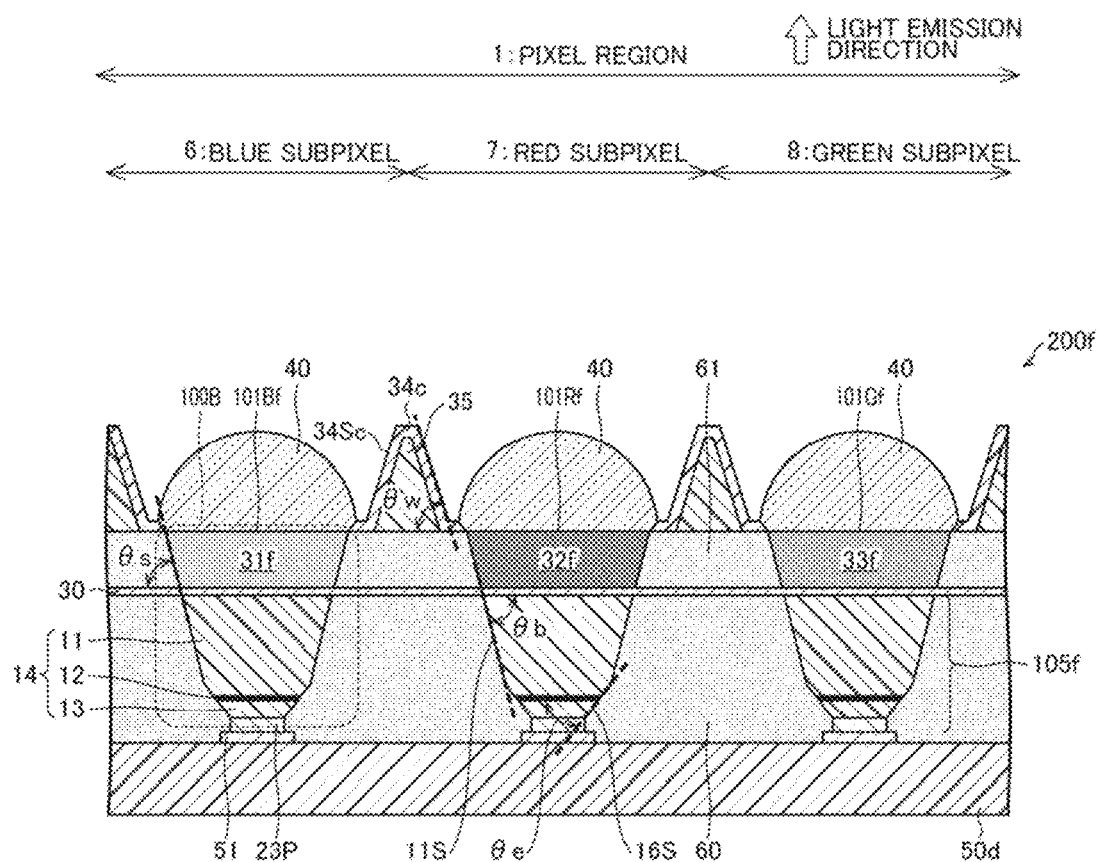

11: N-side layer
11S: Side surface of N-side layer
12: Light emission layer
13: P-side layer
14: Compound semiconductor layer
16S: Inclined surface of light emission layer
23P: P-electrode
30: Common N-electrode
31f: Transparent portion
32f: Red wavelength conversion portion
33f: Green wavelength conversion portion
34c: Partition wall
34Sc: Reflection surface
35: Partition wall body
40: Micro lens
50d: Driving circuit substrate
51: P-drive electrode
60: Embedding material
61: Wavelength conversion portion embedding material
100B: Blue micro light emitting element
101Rf: Light emitting surface of red micro light emitting element
101Gf: Light emitting surface of green micro light emitting element
101Bf: Light emitting surface of blue micro light emitting element
105f: Blue micro LED
200f: Image display device

FIG.12
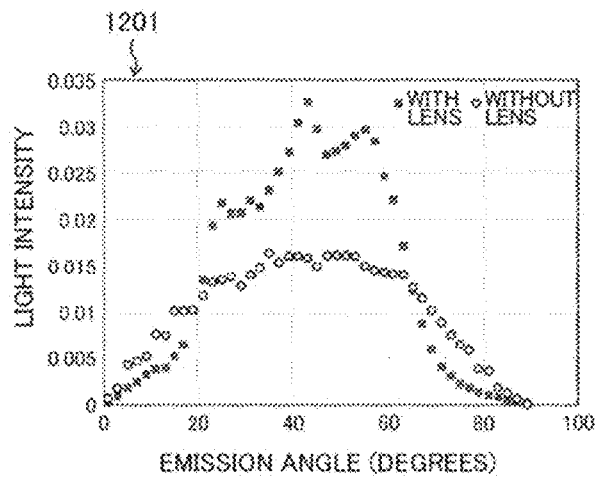
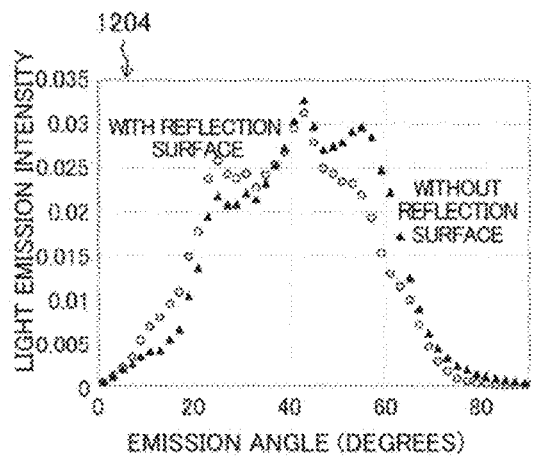
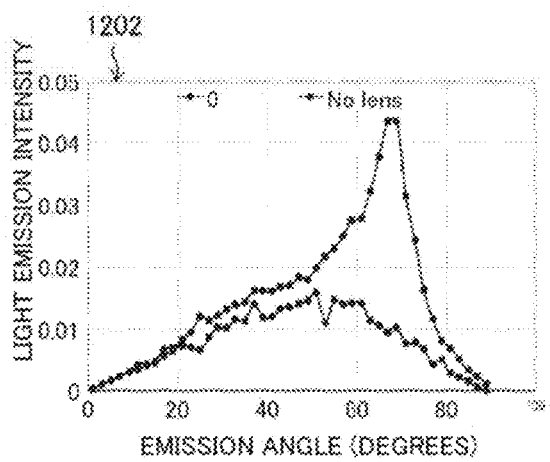
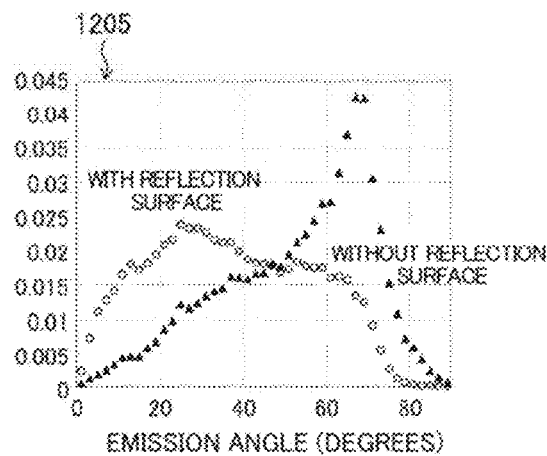
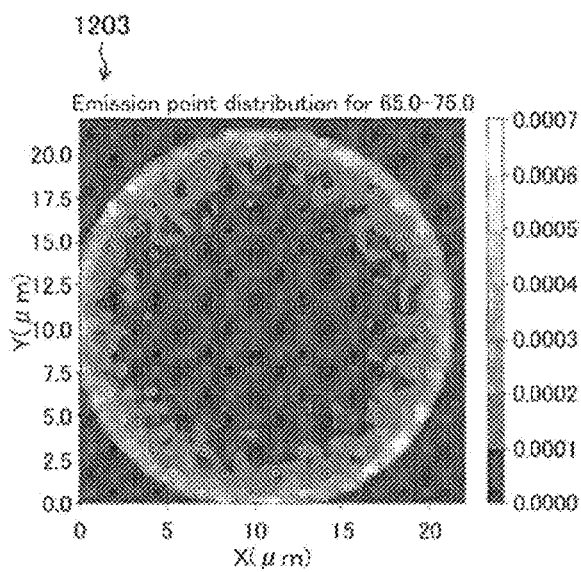
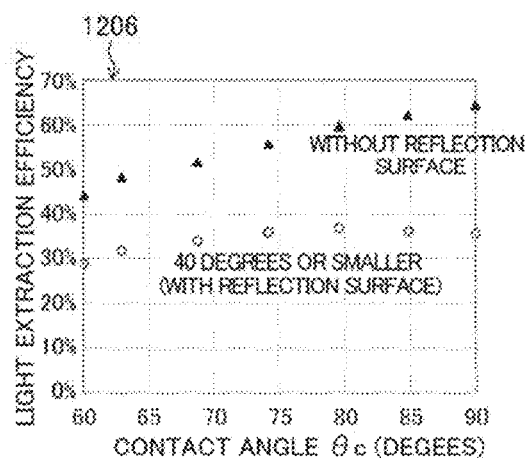

FIG.16

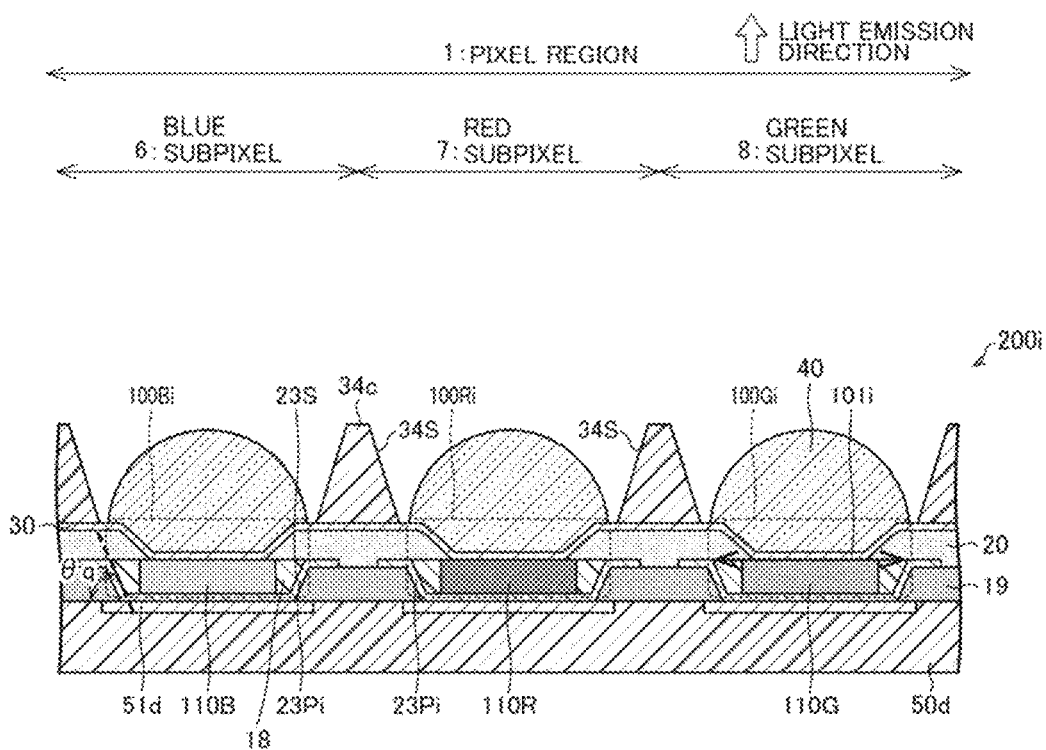

18: Transparent insulating film
19: First insulating film
20: Second insulating film
23P: P-electrode
23S: Side wall of P-electrode
30: Common N-electrode
34c: Partition wall
34S: Reflection surface
40: Micro lens
50d: Driving circuit substrate
51d: P-drive electrode
100R: Red micro light emitting element
100G: Green micro light emitting element
100B: Blue micro light emitting element
101i: Light emitting surface
110R: Red light emission layer
110G: Green light emission layer
110B: Blue light emission layer
200i: Image display device

FIG.17

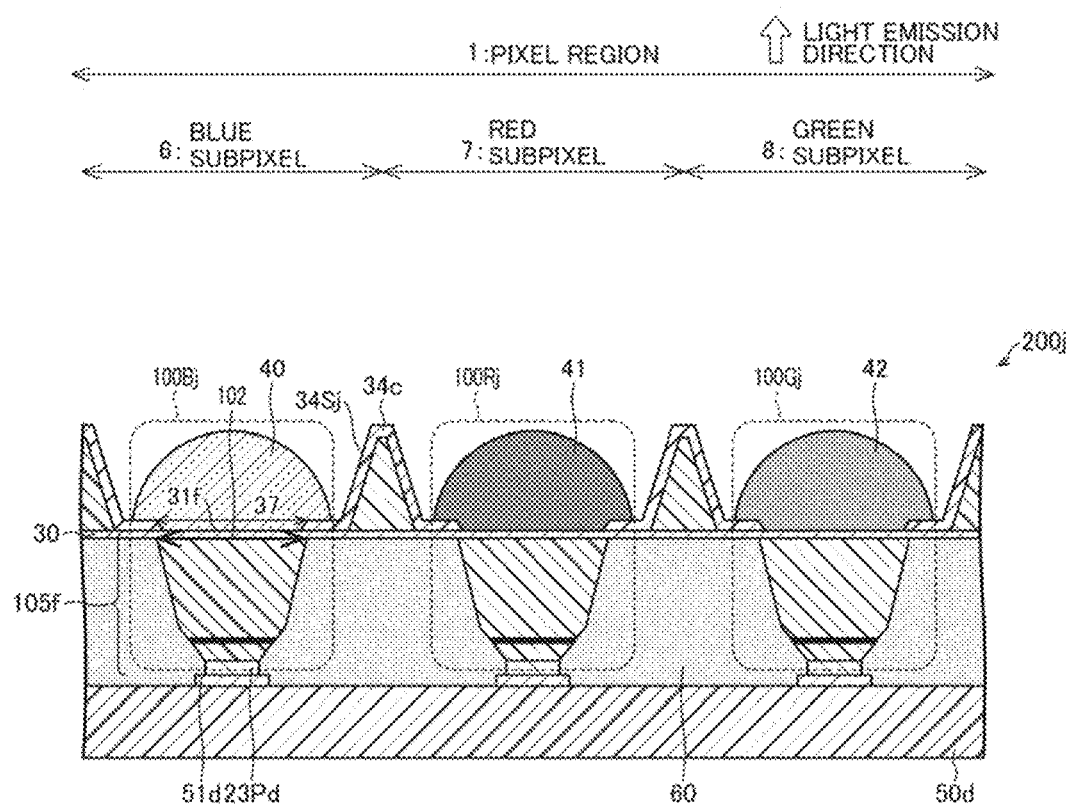

23Pd: P-electrode
31f: Transparent portion
34c: Partition wall
34Sj: Reflection surface
37: Opening
40: Micro lens
41: Red wavelength conversion portion
42: Green wavelength conversion portion
50d: Driving circuit substrate
51d: P-drive electrode
60: Embedding material
100Bj: Blue micro light emitting element
100Rj: Red micro light emitting element
100Gj: Green micro light emitting element
102: Light emitting surface of blue micro LED
105f: Blue micro LED
200j: Image display device

FIG.18

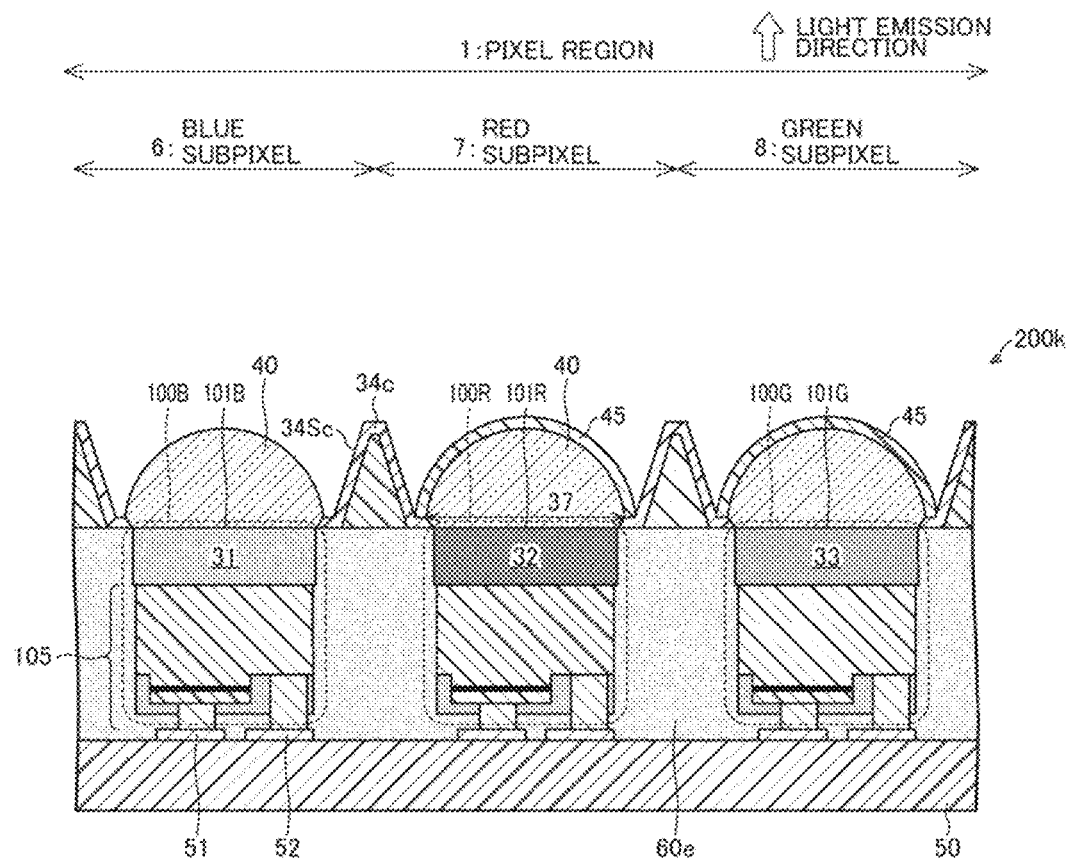

31: Transparent portion
32: Red wavelength conversion portion
33: Green wavelength conversion portion
34c: Partition wall
34Sc: Reflection surface
37: Opening
40: Micro lens
45: Dielectric multilayer film
50: Driving circuit substrate
51: P-drive electrode
52: N-drive electrode
60e: Embedding material
100R: Red micro light emitting element
100G: Green micro light emitting element
100B: Blue micro light emitting element
101R: Light emitting surface of red micro light emitting element
101G: Light emitting surface of green micro light emitting element
101B: Light emitting surface of blue micro light emitting element
105: Blue micro LED
200k: Image display device

IMAGE DISPLAY DEVICE

CROSS REFERENCE TO RELATED APPLICATION

The present application claims priority from Japanese Patent Application No. 2019-125201, filed Jul. 4, 2019, the entire contents of which are hereby incorporated by reference into this application.

BACKGROUND OF THE INVENTION

1. Field of the Invention

The present disclosure relates to an image display device including a plurality of micro light emitting elements.

2. Description of the Related Art

An image display device including a plurality of micro light emitting elements, which constitute pixels, are arranged on a driving circuit substrate has been proposed. For example, in a technology disclosed in Japanese Patent Application Publication No. 2002-141492, a driving circuit is formed on a silicon substrate, and a micro light emitting diode (LED) array, which emits ultraviolet light, is disposed on the driving circuit. In the technology, a small image display device that displays a color image by using a wavelength conversion layer that is disposed on the light emitting diode array and that converts ultraviolet light into visible light in red, green, and blue is disclosed.

Such an image display device, which has high brightness and high durability in spite of a small size, is highly evaluated as an image display device for a glasses-like device, a head-up display (HUD), or the like. In general, such an image display device is manufactured by using a method in which a driving circuit substrate and micro light emitting elements, which are made of different materials, are independently formed and then affixed to each other.

However, the structure of the micro light emitting element and the image display device described in Japanese Patent Application Publication No. 2002-141492 has a problem in that light emission efficiency is low. The main reason for this is that light extraction efficiency, which is the ratio of light emitted to the outside to light generated inside of a compound semiconductor body, is low. The refractive index of a compound semiconductor, from which the micro light emitting element is made, is higher than that of air or a resin. Therefore, when light is incident on an interface between the compound semiconductor and the outside, total reflection occurs in a wide range of the incident angle. As a result, light is confined in the micro light emitting element, and thus light extraction efficiency decreases.

The term "light emission efficiency" refers to efficiency with which an electric current or electric power input to the micro light emitting element is converted into light emitted to the outside. The term "light extraction efficiency" refers to the ratio of light emitted to the outside of a micro light emitting element to light generated in a light emission layer of the micro light emitting element.

Decrease of light emission efficiency due to decrease of light extraction efficiency causes problems such as increase of power consumption and increase of temperature due to heat generation.

Moreover, the micro light emitting element has light emission distribution that is similar to Lambertian distribution, and the emission angle distribution of the micro light emitting element is wide. Therefore, light is not effectively used in an image display device for a small glasses-like device or a mobile display, and excess light is emitted to the outside. As a result, the power consumption increases more than necessary.

It is desirable to realize an image display device that can improve light emission efficiency by suppressing light leakage to an adjacent micro light emitting element and reinforcing light output in the forward direction of the micro light emitting element.

SUMMARY OF THE INVENTION

An image display device according to an aspect of the present disclosure includes: a plurality of micro light emitting elements arranged in an array shape; a driving circuit substrate including a driving circuit that supplies electric currents to the plurality of micro light emitting elements and that causes the plurality of micro light emitting elements to emit light; a plurality of micro lenses in contact with light emitting surfaces of the plurality of micro light emitting elements; and a plurality of partition walls disposed around the plurality of micro lenses in a direction parallel to the light emitting surfaces. A side surface of each of the plurality of partition walls facing a corresponding one of the plurality of micro lenses is inclined so as to open in a light emission direction and is a reflection surface that reflects light.

An image display device according to an aspect of the present disclosure includes: a plurality of micro light emitting elements arranged in an array shape; a driving circuit substrate including a driving circuit that supplies electric currents to the plurality of micro light emitting elements and that causes the plurality of micro light emitting elements to emit light; a plurality of wavelength conversion portions that increase wavelength of excitation light emitted by the plurality of micro light emitting elements; and a plurality of partition walls disposed around the plurality of wavelength conversion portions in a direction parallel to light emitting surfaces of the plurality of micro light emitting elements. The driving circuit substrate, the plurality of micro light emitting elements, and the plurality of wavelength conversion elements are stacked in this order. The plurality of wavelength conversion portions each have a shape including a curved surface that is convex in a light emission direction. A side surface of each of the plurality of partition walls facing a corresponding one of the plurality of wavelength conversion portions is inclined so as to open in the light emission direction and is a reflection surface that reflects light.

With an aspect of the present disclosure, an advantage is obtained in that light emission efficiency can be improved by suppressing light leakage to an adjacent micro light emitting element and reinforcing light output in the forward direction of the micro light emitting element.

BRIEF DESCRIPTION OF THE DRAWINGS

FIG. 4 shows results of simulating emission angle distributions in a case with the micro lens and in a case without the micro lens;

FIG. 11 is a schematic sectional view of a pixel region of an image display device according to a seventh embodiment of the present disclosure;

FIG. 12 shows the results of simulating the light emission distribution of a blue micro light emitting element and the light emission distribution of a red micro light emitting element according to the seventh embodiment of the present disclosure;

FIG. 16 is a schematic sectional view of a pixel region of an image display device according to a tenth embodiment of the present disclosure;

FIG. 17 is a schematic sectional view of a pixel region of an image display device according to an eleventh embodiment of the present disclosure;

FIG. 18 is a schematic sectional view of a pixel region of an image display device according to a twelfth embodiment of the present disclosure.

DETAILED DESCRIPTION OF THE EMBODIMENTS

First Embodiment

Figure 1:
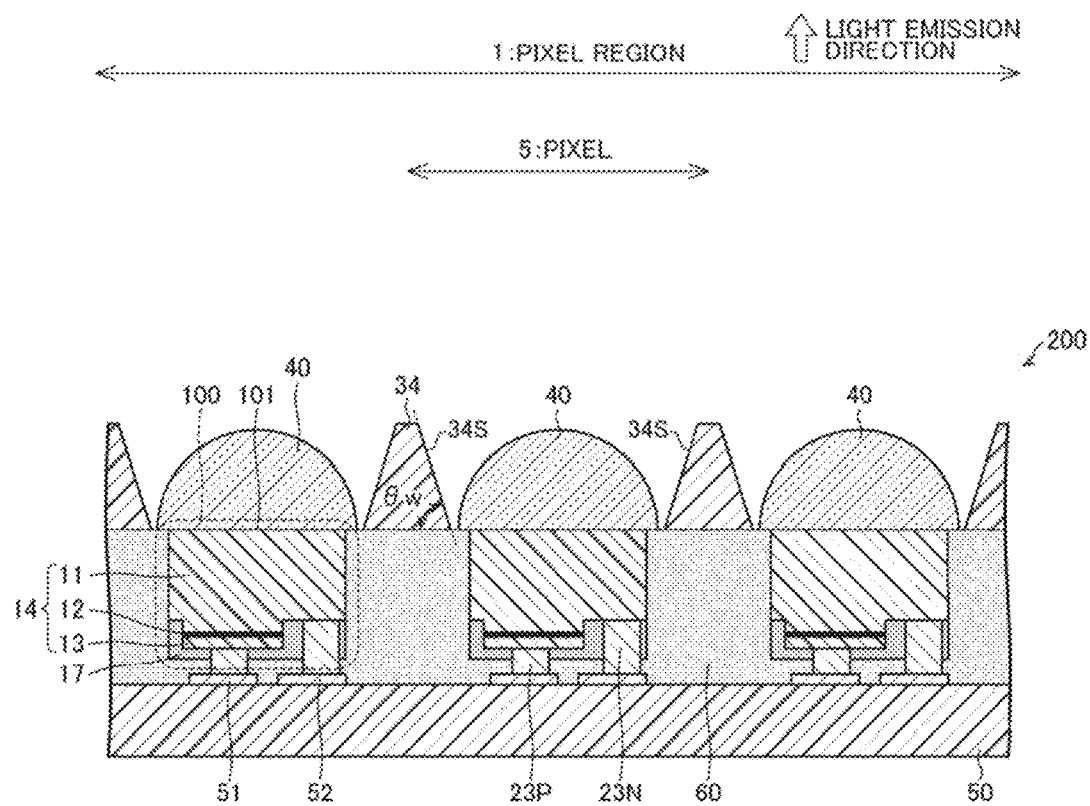
FIG. 1 is a schematic sectional view of a pixel region of an image display device according to a first embodiment of the present disclosure.

Referring to FIGS. 1 to 4, an image display device 200, which includes a plurality of micro light emitting elements 100, according to an embodiment of the present disclosure will be described. The image display device 200 includes the plurality of micro light emitting elements 100 and a driving circuit substrate 50. The driving circuit substrate 50 controls the amount of light emitted from the micro light emitting element 100 by controlling an electric current supplied to each of the micro light emitting elements 100 included in a pixel region 1. The micro light emitting elements 100 emit light in a direction away from the driving circuit substrate 50 (light emission direction).

In describing the configuration of the image display device 200, unless otherwise noted, a surface on a light emitting surface 101 side will be referred to as "upper surface" (first surface), a surface on a side opposite from the light emitting surface 101 side will be referred to as "lower surface" (second surface), and a surface other than the upper surface and the lower surface will be referred to as "side surface".

Driving Circuit Substrate 50

The driving circuit substrate 50 includes a micro light emitting element driving circuit that controls an electric current supplied to each of the micro light emitting elements 100, a row selecting circuit that selects each row of the micro light emitting elements 100 arranged in a two-dimensional matrix pattern, a column signal output circuit that outputs a light emission signal to each column, an image processing circuit that computes a light emission signal based on an input signal, an input output circuit (driving circuit), and the like.

A P-drive electrode 51 (P-drive electrode) and an N-drive electrode 52 (N-drive electrode), which are connected to the micro light emitting element 100, are disposed on a bonding surface side of the driving circuit substrate 50 to which the micro light emitting element 100 is bonded. In general, the driving circuit substrate 50 is a silicon substrate (semiconductor substrate) in which a large-scale integration (LSI) is formed, a glass substrate in which thin film transistors (TFTs) are formed, or the like. The function and configuration of the driving circuit substrate 50, which can be manufactured by using a known technology, will not be described in detail.

Figure 2:
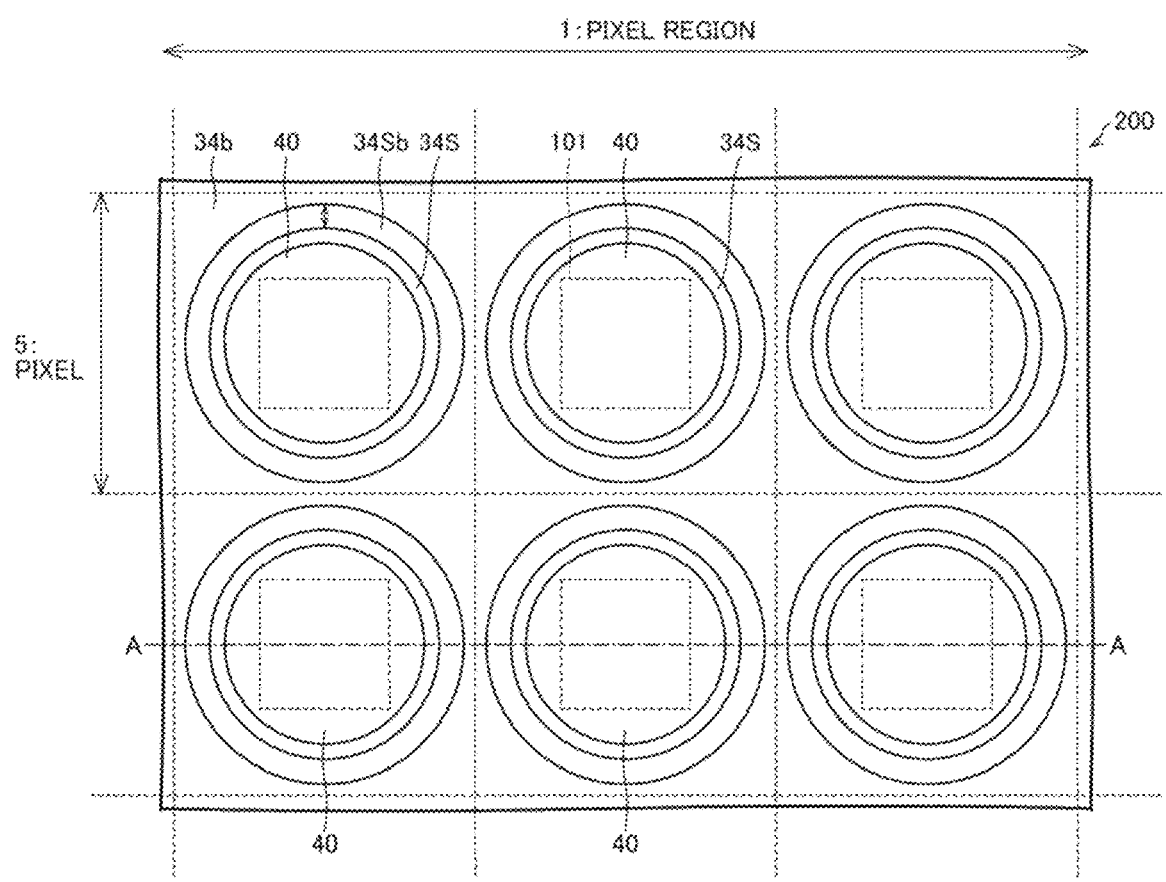
FIG. 2 is a schematic plan view of the pixel region of the image display device according to the first embodiment of the present disclosure.

In an example shown in FIG. 2, the shape of the micro light emitting element 100 as seen from the upper surface side (the light emitting surface 101 side) is substantially a square. However, the shape of the micro light emitting element 100 is not particularly limited. The shape of the micro light emitting element as seen from the upper surface side may be any appropriate planar shape, such as a rectangle, a polygon, a circle, or an ellipse. It is assumed that the maximum diameter, which the largest length (such as the diameter of a circle or the length of the diagonal line of a rectangle) of the micro light emitting element is 60 μm or smaller. It is assumed that the image display device 200 includes, for example, 3000 or more micro light emitting elements 100 that are integrated in the pixel region 1.

Configuration of Image Display Device 200

As illustrated in FIG. 2, the upper surface of the image display device 200 is the pixel region 1 in which a plurality of pixels 5 are arranged in an array shape. In the present embodiment, the image display device 200 is a single-color display device, and each pixel 5 includes one single-color micro light emitting element 100.

The micro light emitting element 100 includes a compound semiconductor layer 14 (compound semiconductor crystal). In the compound semiconductor layer 14, for example, an N-side layer 11, a light emission layer 12, and a P-side layer 13 are stacked. For example, the compound semiconductor layer 14 is an AlInGaN semiconductor, in a micro light emitting element that emits light in a wavelength band from ultraviolet to green, and an AlInGaP semiconductor, in a micro light emitting element that emits light in a wavelength band from yellow-green to red. The compound semiconductor layer 14 is an AlGaAs or GaAs semiconductor, in a micro light emitting element emits light in a wavelength band from red to infrared.

In the present embodiment, regarding the compound semiconductor layer 14 of the micro light emitting element 100, a configuration in which the N-side layer 11 is disposed on a side in the light emission direction will be mainly described. However, the P-side layer 13 may be disposed on a side in the light emission direction. Typically, each of the N-side layer 11, the light emission layer 12, and the P-side layer 13 is not a single layer and includes a plurality of layers and is configured so that each of the layers is functionally optimized. However, the detailed structure of each of the layers, which is not directly related to the essence of the present disclosure, will not be described here.

Typically, the light emission layer 12 is sandwiched between an N-type layer and a P-type layer. However, there may be a case where the N-type layer and the P-type layer may include an undoped layer or may include a layer including a dopant having opposite electroconductivity. Accordingly, in the present specification, regarding two layers that sandwich the light emission layer 12, a semiconductor layer in which an N-type layer is included will be referred to as the N-side layer 11, and a semiconductor layer in which a P-type layer is included will be referred to as the P-side layer 13. In a GaN compound semiconductor, generally, Si is used as an N-type dopant included in an N-type layer, and Mg is used as a P-type dopant included in a P-type layer.

A case where a dopant having "opposite electroconductivity" is added to the N-side layer 11 or the P-side layer 13 is a case where, for example, Si is added to a part of a P-type layer. That is, a case where a part of a P-type layer, which is a P-type layer as a whole, includes an N-type dopant with a low concentration, or the like.

FIG. 1 is a schematic sectional view taken along line A-A shown in FIG. 2. As illustrated in FIGS. 1 and 2, the micro light emitting elements 100 are arranged in a two-dimensional array shape on the driving circuit substrate 50. A P-electrode 23P (P-type electrode) and an N-electrode 23N (N-type electrode) of the micro light emitting element 100 are both formed on the lower surface side of the micro light emitting element 100.

The P-electrode 23P is connected to the P-drive electrode 51 formed on the driving circuit substrate 50. The N-electrode 23N is connected to the N-drive electrode 52 formed on the driving circuit substrate 50. An electric current supplied from the driving circuit substrate 50 to the micro light emitting element 100 is transmitted from the P-drive electrode 51 to the P-side layer 13 via the P-electrode 23P. The electric current that has passed from the P-side layer 13 through the light emission layer 12 flows from the N-side layer 11 to the N-drive electrode 52 via the N-electrode 23N. Thus, in accordance with the amount of electric current supplied from the driving circuit substrate 50, the micro light emitting element 100 emits light with a predetermined intensity.

The micro light emitting elements 100 are each covered with an embedding material 60 and are electrically separated from each other. In a case where the embedding material 60 is a material high light transmission ability, such as a transparent material, a part of the embedding material 60 may cover the light emitting surface 101. In this case, because the embedding material 60 does not have a light blocking function, in order to reduce light leakage between the micro light emitting elements 100, a side wall of each of the micro light emitting element 100 may be covered with a metal film or the like having low light transmission ability.

However, in a case where the embedding material 60 is a material having low light transmission ability, such as a material having a function of blocking light by reflection or absorption of light, in order to reduce light leakage to an adjacent micro light emitting element 100, it is not desirable that the embedding material 60 cover the light emitting surface 101. Accordingly, the height of the light emitting surface 101 may be substantially the same as the embedding material 60. With such a configuration, because the embedding material 60 does not interfere with the light emitting surface 101 of the micro light emitting element 100, light emission by the micro light emitting element 100 is not impeded.

The bottom surface of a micro lens 40, which is in contact with the light emitting surface 101, is a flat surface, and the front surface of the micro lens 40, which is the outer surface, has a shape including a curved surface that is convex in the light emission direction. Examples of such a shape include a so-called dome shape, such as a spherical surface or an ellipsoidal surface. In the present embodiment, the front surface of the micro lens 40 is a dome-shaped curved portion. The inside of the micro lens 40 is filled with a material having high light transmission ability, such as a transparent resin. That is, the micro lens 40 constitutes a convex lens. The bottom surface of the micro lens 40 may have a substantially circular shape and the center thereof may coincide with the center of the light emitting surface 101. If there is a limitation related to area, the shape of the bottom surface may be the same as the shape of the light emitting surface. To be specific, the front surface of the micro lens 40 may be a spherical surface, and the center of the spherical surface may be located within ±1 μm with respect to the center of the light emitting surface 101.

The bottom surface of the micro lens 40 may be in contact with the light emitting surface 101 of the micro light emitting element 100. However, the bottom surface may be in contact with the light emitting surface 101 with a thin transparent film therebetween. The bottom surface of the micro lens 40 may completely cover the light emitting surface 101. For example, the micro lens 40 may be formed from a transparent resin so as to have a lens shape by forming a pattern of the transparent resin by using a photolithography technology and then heating the transparent resin to fluidize the transparent resin. Alternatively, the micro lens 40 may be formed by pressing a mold, which has been processed to have a micro lens array shape, against the driving circuit substrate 50 to which a transparent resin has been applied.

A partition wall 34 is disposed around the micro lens 40 in a direction parallel to the light emitting surface 101. The partition wall 34 has a reflection surface 34S that is inclined at an inclination angle θw so as to open in the light emission direction. In the present embodiment, the partition wall 34 is made of a material having high reflectivity (such as a metal material) and forms the reflection surface 34S around the micro lens 40. That is, the micro lenses 40 are independently provided for the pixels, and adjacent micro lenses 40 are separated by the partition wall 34.

Examples of a material having high reflectivity include silver and aluminum. The partition wall 34 may be formed to have the shape, in which the side wall is inclined so as to open in the light emission direction, by performing taper etching by using a photolithography technology and a dry etching technology. Alternatively, the partition wall 34 may be directly formed by performing a liftoff method to deposit a metal pattern having an inclined side surface. In the present embodiment, as illustrated in FIG. 2, the reflection surface 34S and the front surface of the micro lens 40 are separated by a certain distance. The reflection surface 34S and the micro lens 40 may not be in contact with each other. However, in order to reduce the area of a pixel 5, a bottom part of the partition wall 34 and the micro lens 40 are allowed to be in contact with each other.

With the image display device 200 described above, the partition wall 34 is disposed around the micro lens 40. Therefore, light leakage to an adjacent micro light emitting element 100 can be suppressed. With the image display device 200, the side surface of the partition wall 34 facing the micro lens 40 is the reflection surface 34S that is inclined so as to open in the light emission direction. Therefore, the path of light that is emitted from the micro lens 40 and that propagates toward the partition wall 34 is reflected by the reflection surface 34S and diverted to a direction that is substantially parallel to the forward direction of the micro light emitting element 100 (the center line direction). Therefore, light output in the forward direction of the micro light emitting element 100 is reinforced, and thus brightness in the forward direction of the micro light emitting element 100 can be improved.

Figure 3:
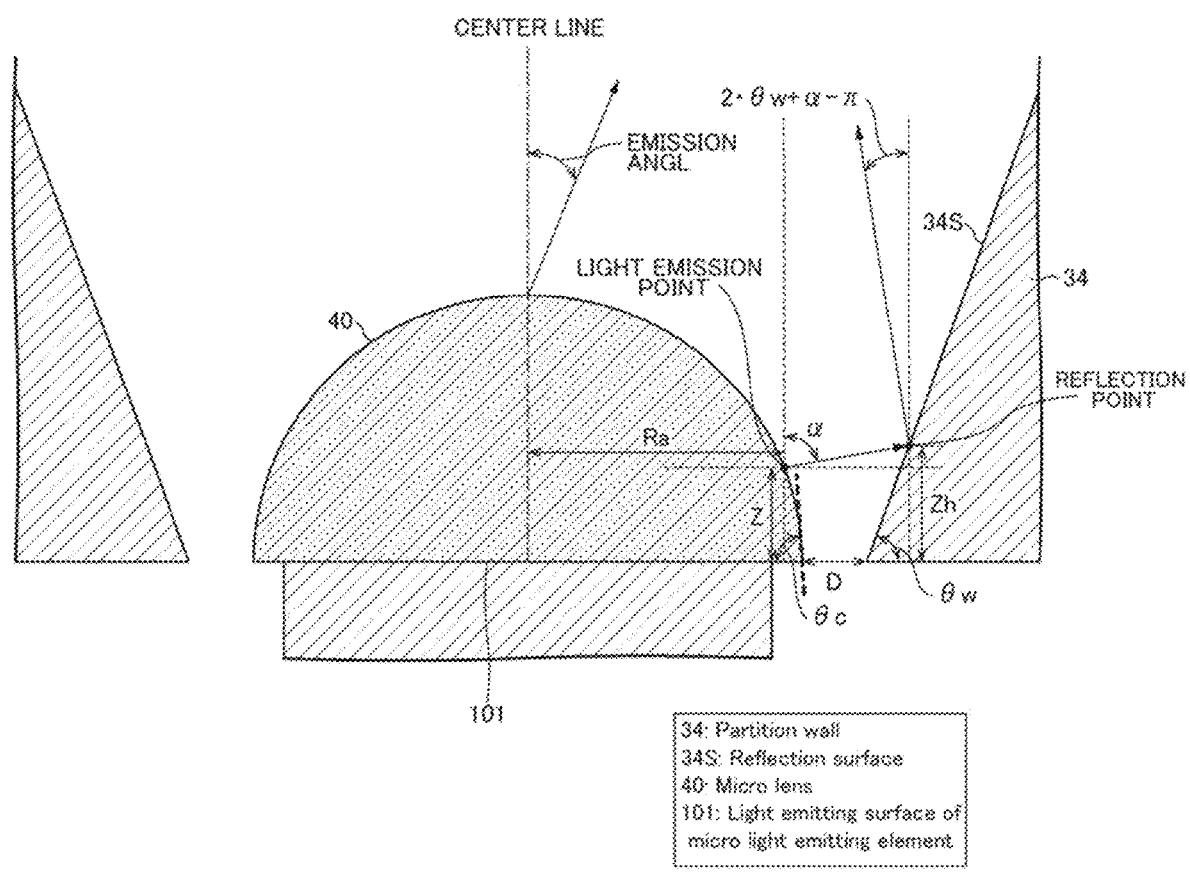
FIG. 3 is a schematic view illustrating the functions of a micro lens and a partition wall.

Referring to FIGS. 3 and 4, the effects of the micro lens 40 and the reflection surface 34S will be described. FIG. 4 shows a graph 401 illustrating the difference in light emission distribution of light emitted from the micro light emitting element 100 between with and without the micro lens 40 (the intensity of light in the direction of azimuth angle is integrated).

As illustrated in FIG. 3, the emission angle is an angle with respect to the center line of the micro lens 40. Because it is difficult to measure light emission distribution, light emission distribution of light emitted from the micro light emitting element 100 is obtained by performing a ray tracing simulation. As illustrated in graph 401 of FIG. 4, light output from the micro light emitting element 100 with the micro lens 40 increases by about 2.5 times at the maximum, compared with a case without the micro lens 40. Here, most of increased light is in a region at an emission angle of 30 degrees or larger.

However, light emitted at a large emission angle is useless, because the light does not reach an observer who sees the image display device 200 from the front side. Also in a case where an image formed by the image display device 200 is projected onto a screen or the like by collecting light emitted from the micro light emitting element 100 by using a lens or the like, such as a glasses-like device or a head-up display (HUD), light emitted at a large emission angle is useless, because the light collection range of the lens is not large (for example, 40 degrees or smaller).

FIG. 4 shows a graph 402 and a graph 403 illustrating the position in the micro lens 40 from which light at an emission angle of 60 degrees or larger, where light emission amount considerably increases, is emitted, in the case with the micro lens 40. The graph 402 of FIG. 4 shows distribution with respect to the height (Z) from the bottom surface of the micro lens 40, and the graph 403 of FIG. 4 shows distribution with respect to the distance (Ra) from the center of the micro lens 40.

From the graph 402 and the graph 403 of FIG. 4, it can be seen that light emitted at a large emission angle is emitted mainly from a height Z of about 0 μm, that is, an outer peripheral part of the micro lens 40.

This result shows that, by providing the micro lens 40, light that is emitted from the light emitting surface 101 of the micro light emitting element 100 toward an adjacent micro light emitting element 100 increases. The light is reflected by the micro lens 40 of the adjacent micro light emitting element 100 and looks as if the light is emitted from the adjacent pixel. That is, when the micro lens 40 is provided, it might occur that light leakage between adjacent micro light emitting elements 100 increases. Here, by providing the partition wall 34 on the outer periphery of the micro lens 40, light that is emitted toward an adjacent micro light emitting element 100 can be blocked. Accordingly, the problem of light leakage does not occur. Moreover, as illustrated in FIG. 3, it is possible to effectively use light that is emitted at a large emission angle α by reflecting the light in the forward direction of the micro light emitting element 100. The emission angle α is the angle between the center line direction and the direction in which light is emitted.

In an outer peripheral part of the micro lens 40, light emitted from a height Z at an emission angle α is reflected by the reflection surface 34S, having an inclination angle θw, at an angle of $2 \times \theta w + \alpha - \pi$ ($\pi$ radian=180 degrees) with respect to the center line. That is, the emission angle is converted from α to $2 \times \theta w + \alpha - \pi$. For example, θw=52.5 degrees so that light emitted at α=75 degrees can be reflected in the center line direction. At this time, light emitted at an angle α in the range of 60 degrees to 90 degrees is converted by the reflection surface 34S into light emitted at a new emission angle of 0 degrees to 15 degrees. θw=60 degrees so that light emitted at α=60 can be reflected in the center line direction. At this time, light emitted at an angle α in the range of 60 degrees to 90 degrees is converted by the reflection surface 34S into light emitted at a new emission angle of 0 degrees to 30 degrees. θw is not limited to this, may be larger than, for example, 45 degrees, and may be approximately 45 degrees or larger and 60 degrees or smaller.

As illustrated in FIG. 3, when the distance from an end part of the micro lens 40 to an end part of the bottom part of the reflection surface 34S is denoted by D, a height Zh at which light emitted at an emission angle α from a height Z is reflected by the reflection surface 34S can be represented by the following equation (1).

$$Zh = \{Z + (D + \tfrac{1}{2} \times Z^2/R)\} / \{1 - 1/(\tan \theta w \times \tan \alpha)\} \tag{1}$$

R is the radius of curvature of the dome-shaped surface of the micro lens 40. Because Zh increases as D increases, it is necessary to increase the height of the partition wall 34. Accordingly, it is desirable that D be small so that the image display device 200 can be manufactured easily. That is, it is desirable that the distance from an end part of the micro lens 40 to an end part of the bottom part of the reflection surface 34S be as small as possible. If this condition is satisfied and further Z/R is sufficiently smaller than 1.0, Zh can be approximated by using a formula that is simplified compared with the equation (1) as follows: $Zh \approx Z/\{1-1/(\tan \theta w \times \tan \alpha)\}$.

In the example shown in FIG. 3, Zh=4.7 μm when Z=2 μm, θw=45 degrees, and α=60 degrees. Here, the height of the partition wall 34 in the center line direction is approximately smaller than the height of the micro lens 40 in the center line direction. That is, it is sufficient that the height of the partition wall 34 in the center line direction is smaller than or equal to the height of the micro lens 40 in the center line direction.

Here, the emission angle distribution of light emission amount is simulated in a case where θw=60 degrees, D=0, and the height of the partition wall 34 is equal to R (=5.8 μm). As illustrated in the graph 404 of FIG. 4, it can be seen that the distribution is shifted in a direction toward a smaller emission angle in a case with the reflection surface 34S of the partition wall 34, compared with a case without the reflection surface 34S.

Moreover, the light extraction efficiency is simulated while changing the magnitude of θw and the height of the partition wall 34. The graph 405 of FIG. 4 shows the dependency of light extraction efficiency on θw in a case where the height of the partition wall 34 is equal to R. This graph shows the light extraction efficiency of the entire emission light at any emission angles (the entire emission amount) and the light extraction efficiency of light at an emission angle of 40 degrees or smaller (emission angle≤40 degrees). The light extraction efficiency of light at an emission angle of 40 degrees or smaller is an indicator of the concentration of light in the forward direction. As illustrated in the graph 405 of FIG. 4, when θw is in the range of 45 degrees to 70 degrees, a half or more of the entire emission light can be concentrated in the range of emission angle of 40 degrees or smaller.

The graph 406 of FIG. 4 shows the dependency of the light extraction efficiency on the height of the partition wall 34 (θw=60 degrees). As the height of the partition wall 34 increases, the light extraction efficiency of light at an emission angle of 40 degrees or smaller increases. However, it is not possible to make the partition wall 34 excessively high. As illustrated in FIG. 3, as the height of the partition wall 34 increases, the width of a bottom part of the partition wall 34 increases, and the size of the light emitting surface becomes limited. Accordingly, the height of the partition wall 34 may be about the same as the height of the micro lens 40.

As described above, the light output can be considerably increased by disposing the micro lenses 40 so as to cover the light emitting surface 101 of the micro light emitting element 100. Moreover, by providing the partition wall 34, having the reflection surface that is inclined so as to open in the light emission direction, around the micro lens 40, light leakage to an adjacent micro light emitting element 100 can be suppressed, and light emitted in the center line direction can be increased. As a result, light usage efficiency can be increased.

Second Embodiment

Figure 5:
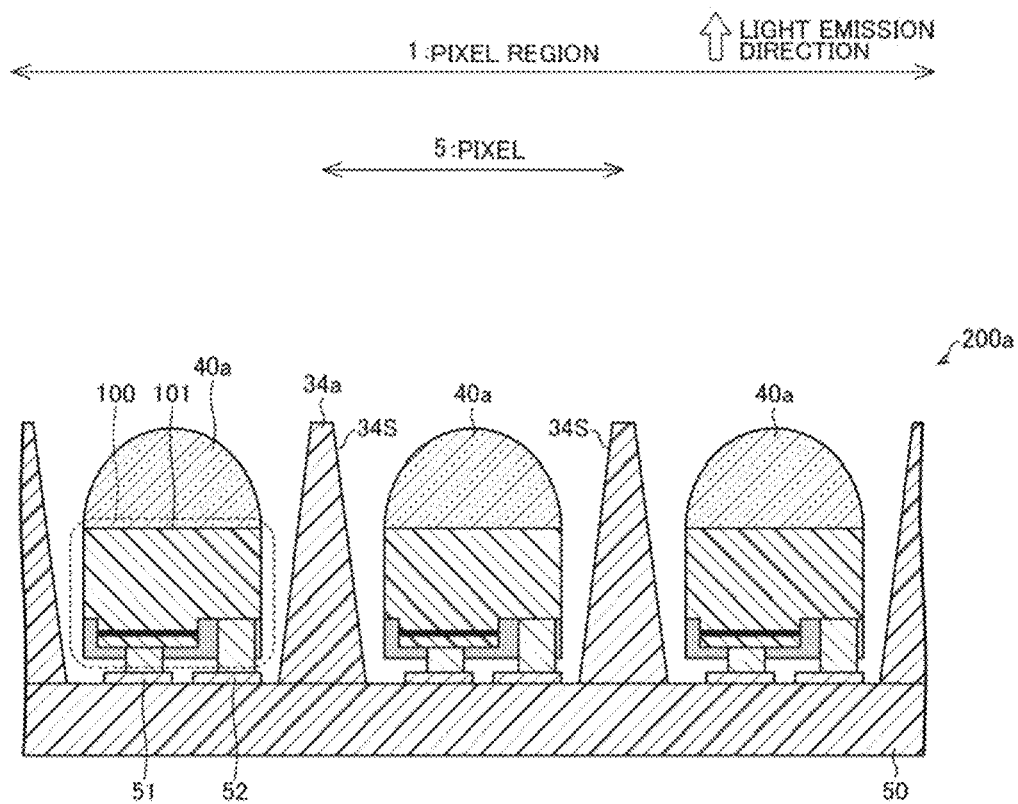
FIG. 5 is a schematic sectional view of a pixel region of an image display device according to a second embodiment of the present disclosure.

Referring to FIG. 5, another embodiment of the present disclosure will be described. For convenience of description, members having the same functions as the members described in the first embodiment will be denoted by the same numerals, and descriptions of such members will not be repeated. The same applies to the third and other embodiments.

In an image display device 200a according to the present embodiment, the configuration of a partition wall 34a differs from that of the image display device 200 according to the first embodiment. With the present embodiment, it is intended to realize an image display device having a pixel larger than that of the first embodiment. In the first embodiment, the micro light emitting element 100 is covered with the embedding material 60, and the partition wall 34 is provided thereon. However, in the present embodiment, without using the embedding material 60, the partition wall 34a is provided directly on the driving circuit substrate 50. Such a configuration can be used in a case where the pixel pitch is large and the space between the micro light emitting elements 100 can be made large.

The partition wall 34a is formed so as to have a height approximately equal to the height of a micro lens 40a. The height of the partition wall 34a is not limited to this, and may be smaller than the height of the micro lens 40a, provided that the height of the partition wall 34a is larger than that of the position of the bottom surface of the micro lens 40a. Accordingly, the height of the partition wall 34a is larger than the height of the partition wall 34 according to the first embodiment, and thus it is possible to form the partition wall 34a beforehand by using a mold and to affix the partition wall 34a onto the driving circuit substrate 50. In the present embodiment, a light blocking effect similar to that of the embedding material 60 can be obtained by the partition wall 34a. Therefore, also with the present embodiment, advantageous effects similar to those of the first embodiment can be realized.

Third Embodiment

Figure 6:
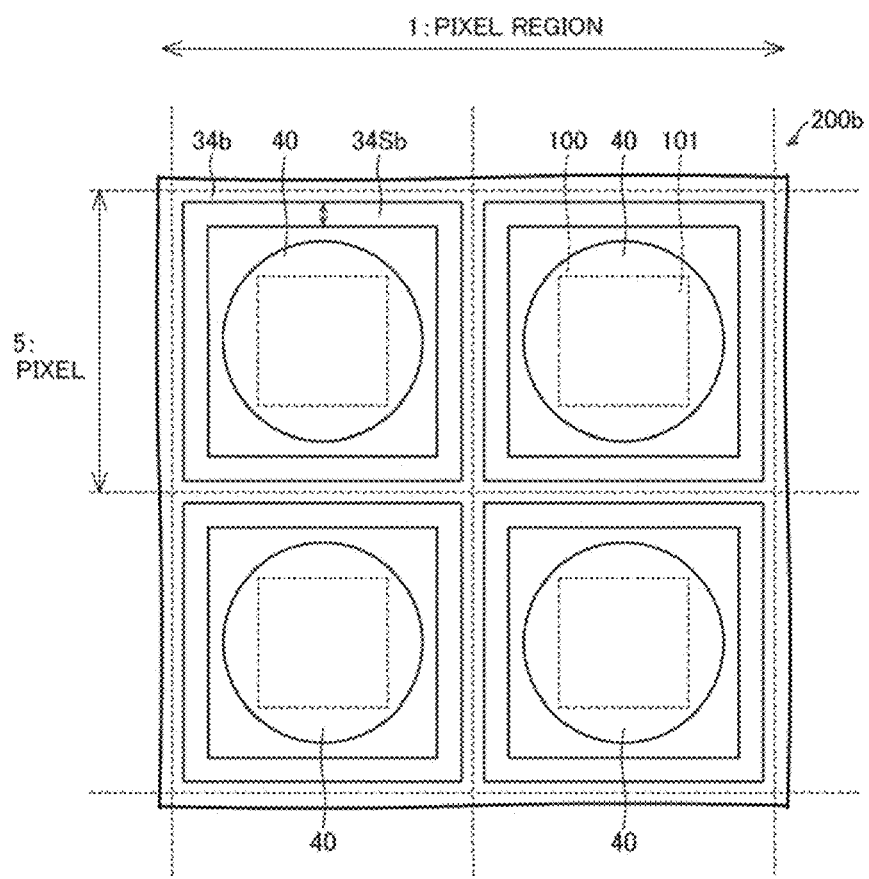
FIG. 6 is a schematic plan view of a pixel region of an image display device according to a third embodiment of the present disclosure.

Referring to FIG. 6, another embodiment of the present disclosure will be described. In an image display device 200b according to the present embodiment, the shape of a partition wall 34b differs from that of the image display device 200 according to the first embodiment. In the first embodiment, the planar shape of the micro lens 40 is circular, and the reflection surface 34S also has a circular shape so as to be separated by a constant distance from the surface of the micro lens 40. However, as illustrated in FIG. 6, the partition wall 34b may have a shape such that a reflection surface 34Sb is parallel to edges of the rectangular pixel 5. In other words, the cross-sectional shape of the partition wall 34b as seen from the light emitting surface 101 side of the micro light emitting element 100 may be rectangular. Also with the present embodiment, advantageous effects similar to those of the first embodiment can be realized. The present configuration has an advantage in that it is easy to form the partition wall 34.

Fourth Embodiment

Figure 7:
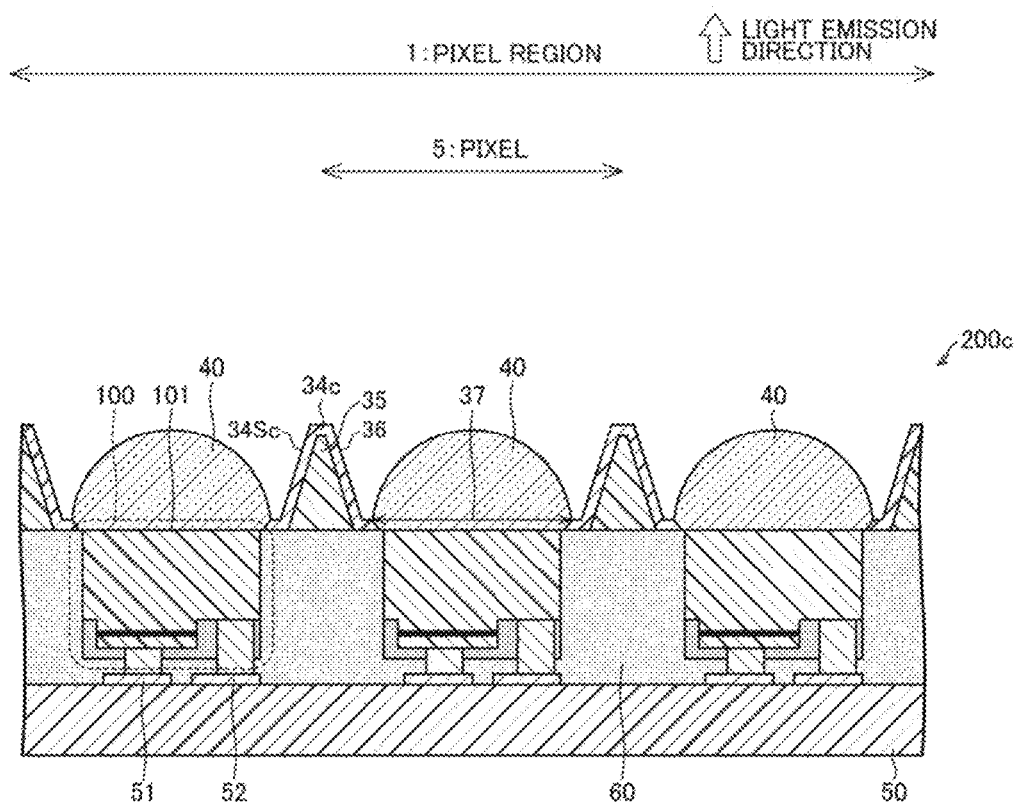
FIG. 7 is a schematic sectional view of a pixel region of an image display device according to a fourth embodiment of the present disclosure.

Referring to FIG. 7, another embodiment of the present disclosure will be described. In an image display device 200c according to the present embodiment, the configuration of a partition wall 34c differs from that of the image display device 200 according to the first embodiment.

As illustrated in FIG. 7, the partition wall 34c according to the present embodiment includes a partition wall body 35 and a partition wall reflector 36. In the partition wall 34c, the surface of the partition wall reflector 36, which is formed on a side surface the partition wall 34c facing the micro lens 40, is a reflection surface 34Sc. In a case where the thickness of the partition wall reflector 36 is substantially constant over the entirety of the side surface, the inclination angle θw of the reflection surface 34Sc is approximately equal to the inclination angle of the side surface of the partition wall body 35. The partition wall body 35 may be made of, for example, an inorganic material such as $SiO_2$ or SiN, or a resin material such as a photo resist material. The partition wall reflector 36 may be made from, for example, a highly reflective metal film or the like. The partition wall 34c may be composed of a plurality of members, provided that the reflection surface 34Sc can efficiently reflect light.

In order to form the partition wall 34 from a single reflector as in the first embodiment, it is necessary to deposit a metal film having a height larger than or equal to the height of the partition wall 34 during manufacturing and then process the metal film into the shape of the partition wall 34, having an inclined surface, by using a photolithography method or a dry etching technology. Because the height of the partition wall 34 may be as large as several micrometers, it is necessary to deposit a very thick metal film. However, such a thick metal film generally has a large surface roughness, and it is difficult to precisely align the metal film with an underlying layer (in the present embodiment, the embedding material 60). Moreover, because it is desirable that the bottom part of the reflection surface 34S do not cover the light emitting surface 101 of the micro light emitting element 100, as the pixel size of the pixel 5 of the image display device 200c decreases, it becomes more necessary to precisely align the partition wall 34 with the light emitting surface 101. Thus, the present embodiment is intended to avoid the above problem by forming a central part of the partition wall 34c (the partition wall body 35) from a transparent material having a small surface roughness, which can be aligned precisely and easily, and by covering the surface of the body part with the partition wall reflector 36.

An opening 37 is formed in the partition wall reflector 36. The opening 37 may have a shape that covers the entirety of the light emitting surface 101. That is, the partition wall reflector 36 may not overlap the light emitting surface 101. The bottom part of the micro lens 40 may cover the entirety of the opening 37. Also with the present embodiment, advantageous effects similar to those of the first embodiment can be realized.

Fifth Embodiment

Figure 8:
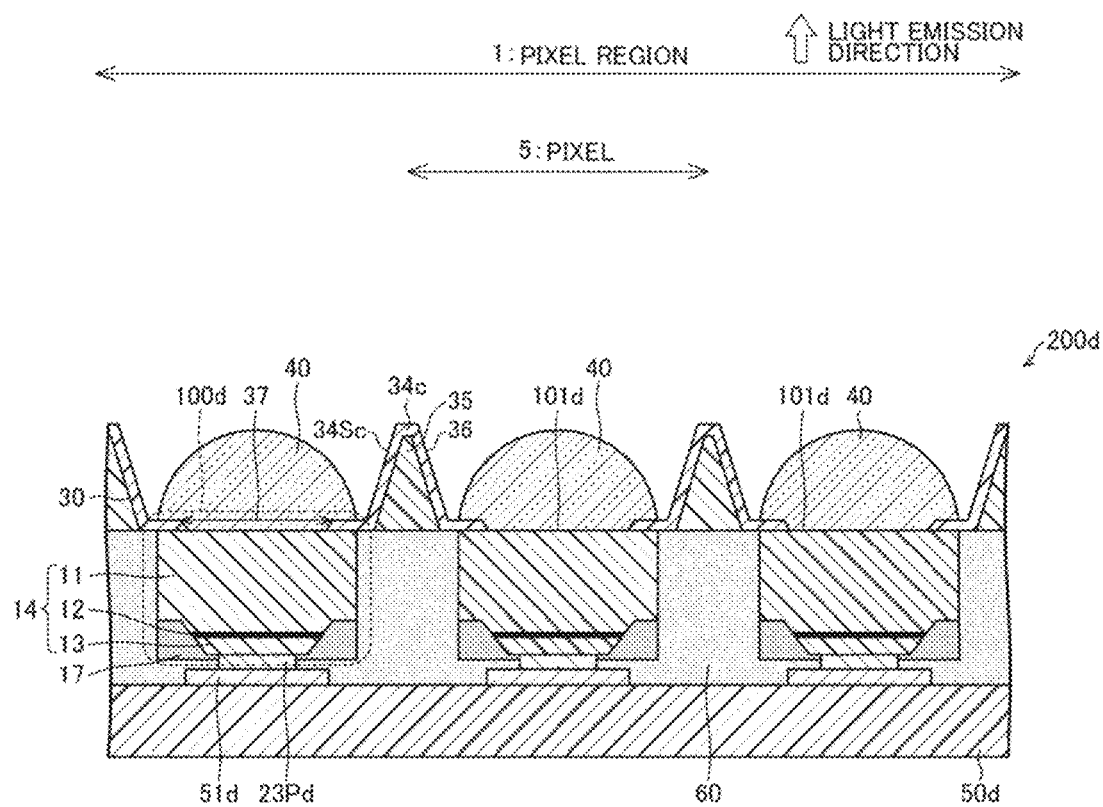
FIG. 8 is a schematic sectional view of a pixel region of an image display device according to a fifth embodiment of the present disclosure.

Referring to FIG. 8, another embodiment of the present disclosure will be described. In an image display device 200d according to the present embodiment, a micro light emitting element 100d differs from the micro light emitting element 100 according to the first embodiment. That is, the micro light emitting elements 100 has the P-electrode 23P and the N-electrode 23N on the lower surface side of the compound semiconductor layer 14 affixed to the driving circuit substrate 50. The micro light emitting element 100d has a P-electrode 23Pd (lower electrode, first electrode) on the lower surface side of the compound semiconductor layer 14 and a common N-electrode 30 (upper electrode, second electrode) on the light emitting surface 101 side of the compound semiconductor layer 14. The present configuration has an advantage in that it is easy to reduce the size of the micro light emitting element 100d, because it is not necessary to provide an N-type electrode on the lower surface side of the compound semiconductor layer 14. The P-electrode 23Pd (first electrode) is provided for each the micro light emitting elements 100d, and the common N-electrode 30 (second electrode) is provided so as to connect (to extend between) the micro light emitting elements 100d. In a case where the P-side layer 13 is disposed on a side in the light emission direction, the first electrode is an N-electrode and the second electrode is a P-electrode.

In the image display device 200d, the common N-electrode 30 and an N-drive electrode 52 on a driving circuit substrate 50d are connected at a position outside the pixel region 1. Here, the connection method, which is not directly related to the essence of the present disclosure, will not be illustrated. The P-electrode 23Pd is connected to a P-drive electrode 51d on the driving circuit substrate 50d. An electric current supplied from the driving circuit substrate 50d to the micro light emitting element 100d is transmitted from the P-drive electrode 51d to the P-side layer 13 via the P-electrode 23Pd. The electric current that has passed from the P-side layer 13 through the light emission layer 12 flows from the N-side layer 11 to the N-drive electrode 52 through the common N-electrode 30. Thus, in accordance with the amount of electric current supplied from the driving circuit substrate 50d, the micro light emitting element 100d emits light with a predetermined intensity.

The micro light emitting elements 100d are electrically separated by the embedding material 60, as with the micro light emitting element 100 according to the first embodiment. In particular, in the micro light emitting element 100d, the side surface around the light emission layer 12 are formed as an inclined surface that is inclined so as to open in the light emission direction at an angle in the range of about 30 degrees to 60 degrees. Thus, by inclining the side surface around the light emission layer 12 so as to open in the light emission direction, the light extraction efficiency from the micro light emitting element 100d can be improved. An inclined portion, which is formed on a surface of the micro light emitting element 100d opposite from a light emitting surface 101d, is covered with a protective film 17, which is a transparent insulating film. A side of the protective film 17 opposite from the compound semiconductor layer 14 may be covered with a highly reflective metal film.

Typically, the common N-electrode 30 is made from a transparent conductive film. However, in the present embodiment, the partition wall reflector 36, which has been shown in the fourth embodiment, is used as the common N-electrode 30. Because the reflection surface 34Sc of the partition wall 34c needs to be a surface that efficiently reflects light, a metal film, such as a silver film or an aluminum film, is typically used as a part of the partition wall 34c. The manufacturing process can be simplified by using such a component of the partition wall 34c also as the common N-electrode 30. The partition wall reflector 36 is adjacent to the N-side layer 11 at the light emitting surface 101d. That is, the opening 37, which formed in the partition wall reflector 36, is not formed in the entirety of the light emitting surface 101d but inside of the light emitting surface 101d. The configuration of the micro lens 40 is similar to that of the fourth embodiment. Also with the present embodiment, advantageous effects similar to those of the first embodiment can be realized.

Sixth Embodiment

Figure 9:
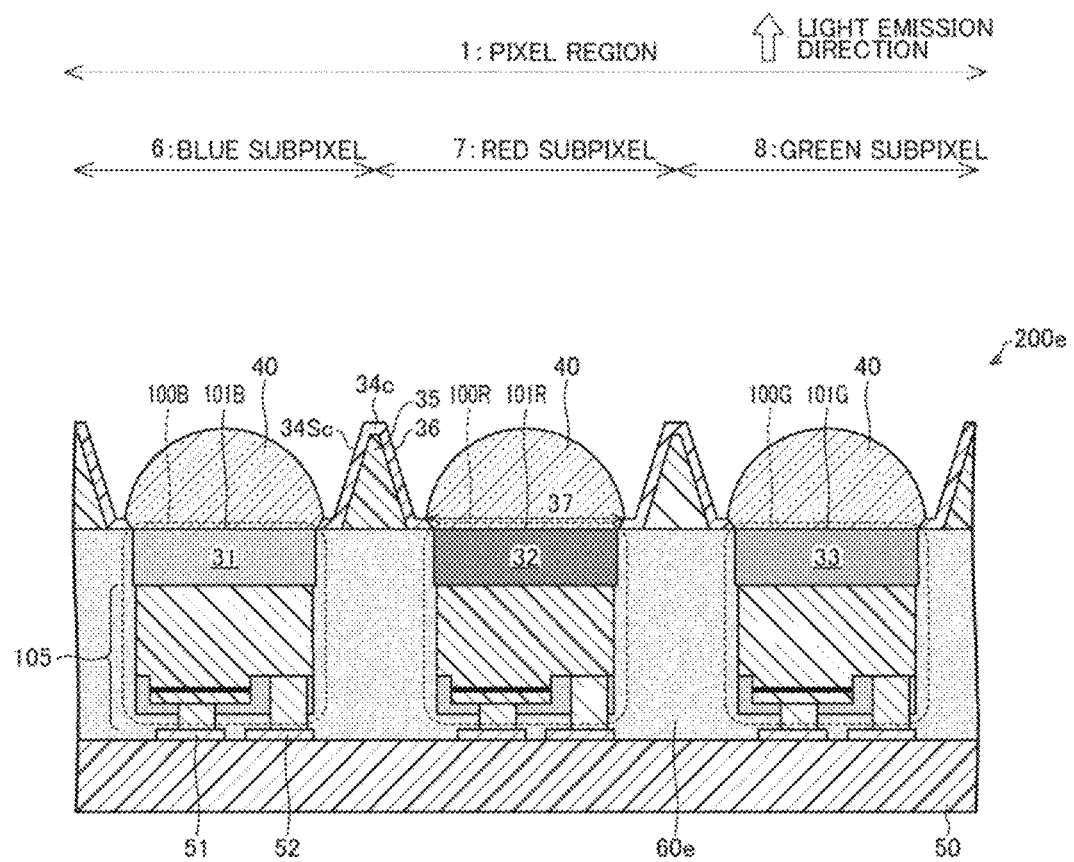
FIG. 9 is a schematic sectional view of a pixel region of an image display device according to a sixth embodiment of the present disclosure.
Figure 10:
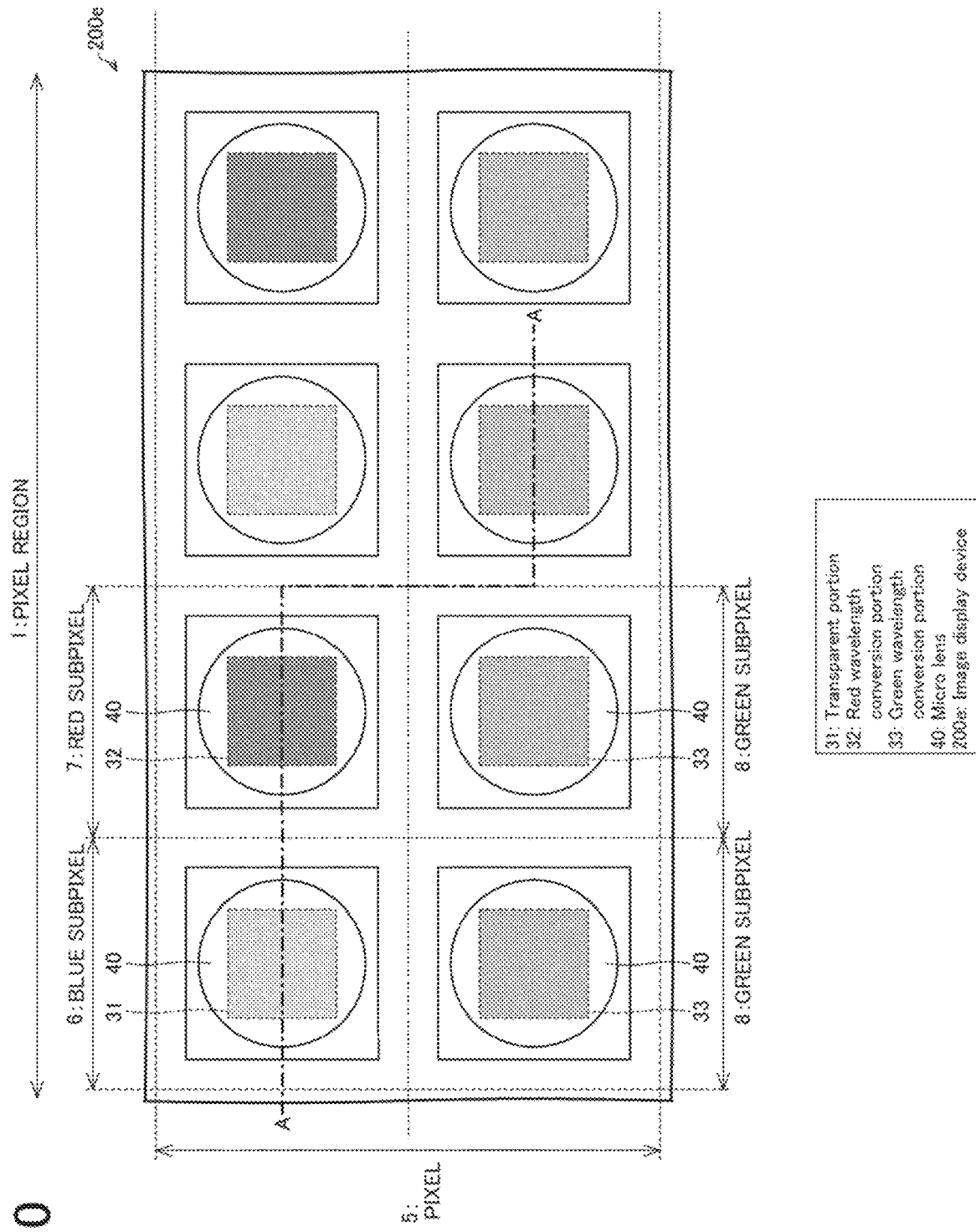
FIG. 10 is a schematic plan view of the pixel region of the image display device according to the sixth embodiment of the present disclosure.

Referring to FIGS. 9 and 10, another embodiment of the present disclosure will be described. FIG. 9 is a schematic sectional view taken along line A-A in FIG. 10. An image display device 200e according to the present embodiment is a full color display device capable displaying three primary colors RGB, and a pixel 5 includes a blue subpixel 6, a red subpixel 7, and green subpixels 8. As illustrated in FIG. 10, the blue subpixel 6 includes one blue micro light emitting element 100B (micro light emitting element), and the red subpixel 7 includes one red micro light emitting element 100R (micro light emitting element). As illustrated in FIG. 10, the pixel 5 includes two green subpixels 8 each including one green micro light emitting element 100G (micro light emitting element).

The red micro light emitting element 100R is composed of a blue micro LED 105 (micro LED) that emits blue light and a red wavelength conversion portion 32 (wavelength conversion portion). Likewise, the green micro light emitting element 100G is composed of a blue micro LED 105 and a green wavelength conversion portion 33 (wavelength conversion portion). The blue micro light emitting element 100B is composed of a blue micro LED 105 and a transparent portion 31.

The blue micro LED 105 is similar to the micro light emitting element 100 according to the first embodiment. A light emitting surface 101B of the blue micro light emitting element 100B is the upper surface of the transparent portion 31. A light emitting surface 101R of the red micro light emitting element 100R is the upper surface of the red wavelength conversion portion 32, and a light emitting surface 101G of the green micro light emitting element 100G is the upper surface of the green wavelength conversion portion 33. In the present configuration, regarding red and green, blue light is used as excitation light and a wavelength conversion portion that performs down-conversion of wavelength is provided; and excitation light itself is used as blue light. In the present specification, the term "down-conversion" refers to an operation of increasing the wavelength (decreasing the energy) of excitation light.

However, it is also possible to generate blue light by using near-ultraviolet light or ultraviolet light as excitation light and by performing down-conversion of the excitation light. In the following description, when it is not particularly necessary to discriminate among the transparent portion 31, the red wavelength conversion portion 32, and the green wavelength conversion portion 33, each of these may be simply referred to as "wavelength conversion portion".

The blue micro light emitting element 100B, the red micro light emitting element 100R, and the green micro light emitting element 100G, excluding a side thereof in the light emission direction, are surrounded and covered with an embedding material 60e, as with the first embodiment. That is, not only the blue micro LED 105 but also the transparent portion 31, the red wavelength conversion portion 32, and the green wavelength conversion portion 33, excluding a side thereof in the light emission direction, are surrounded and covered with the embedding material 60e.

The micro lens 40 and the partition wall 34c are similar to those of the fourth embodiment, which are illustrated in FIG. 7. The difference from FIG. 7 is that the light emitting surfaces 101B, 101R, and 101G are respectively the upper surfaces of the transparent portion 31, the red wavelength conversion portion 32, and the green wavelength conversion portion 33. Also with the present embodiment, advantageous effects similar to those of the first embodiment can be realized. Moreover, the present embodiment has an advantage in that, by using a nitride semiconductor having high light emission efficiency and high durability, a full color display having high brightness can be realized by using one image display device 200e.

Seventh Embodiment

Referring to FIGS. 11 and 12, another embodiment of the present disclosure will be described. An image display device 200f according to the present embodiment is a full color display device similar to the image display device 200e according to the sixth embodiment. The difference from the image display device 200e is the shape and configuration of a blue micro LED 105f that generates excitation light and the shapes of a transparent portion 31, a red wavelength conversion portion 32 (wavelength conversion portion), and a green wavelength conversion portion 33 (wavelength conversion portion).

In order to improve the light extraction efficiency of the blue micro LED 105f that generates excitation light, a side surface 16S around the light emission layer 12 is inclined so as to open in the light emission direction at an angle θe of about 30 degrees or larger and 60 degrees or smaller with respect to the light emission layer 12, and a side surface 11S of the N-side layer 11 is also inclined at an angle θb of about 70 degrees or larger and 85 degrees or smaller with respect to the common N-electrode 30. The light extraction efficiency can be further improved by forming these inclined surfaces, for example, by covering a compound semiconductor with a film having high light transmission ability such as a transplant insulating film and by further covering the outside of the insulating film with a highly reflective metal film such as an aluminum film or a silver film.

As illustrated in FIG. 11, in the image display device 200f, the light emission layer 12 and the P-side layer 13 are disposed on the driving circuit substrate 50d side, the P-electrode 23P (first electrode) is disposed on the driving circuit substrate 50d side, and the common N-electrode 30 (second electrode) is disposed on the light emitting surface side. However, advantageous effects similar to those of the image display device 200f can be obtained, even if the P-side layer 13 and the light emission layer 12 are disposed on the light emitting surface side without changing the shapes of the image display device 200f and the blue micro LED 105f. In this case, the first electrode is an N-electrode, and the second electrode is a common P-electrode. Moreover, the polarity of the driving electrode of the driving circuit substrate 50d is also inverted.

Side walls of the transparent portion 31, the red wavelength conversion portion 32, and the green wavelength conversion portion 33 may be inclined so as to open in the light emission direction at an angle θs of about 45 degrees or larger and 85 degrees or smaller with respect to the common N-electrode 30.

The light extraction efficiency from the wavelength conversion portions can be improved by inclining the side walls of the wavelength conversion portions so as to open in the light emission direction. The light extraction efficiency from the transparent portion 31 can be improved by inclining the side wall of the transparent portion 31 so as to open in the light emission direction.

Moreover, the light extraction efficiency can be further improved by covering the side walls of the transparent portion 31, the red wavelength conversion portion 32, and the green wavelength conversion portion 33 with a highly reflective metal film.

In the present embodiment, a transparent conductive film is used as the common N-electrode 30. With such a configuration, after affixing the blue micro LED 105f, which is an excitation light source, to the driving circuit substrate 50d, the embedding material 60 is formed, and the common N-electrode 30 is formed thereon. Subsequently, the transparent portion 31, the red wavelength conversion portion 32, the green wavelength conversion portion 33, and a wavelength conversion portion embedding material 61 that covers these, are formed.

FIG. 12 illustrates results of simulating the emission angle distribution of blue light and red light in the present embodiment. The graph 1201 of FIG. 12 shows, regarding blue light, comparison between a case with the micro lens 40 and a case without the micro lens 40. The graph 1202 of FIG. 12 shows, regarding red light, comparison between a case with the micro lens 40 and a case without the micro lens 40. As shown in Table 1 and Table 2 below, for both of blue light and red light, light emission amount ("External Emission" in Table 1 and Table 2) in the case with the micro lens 40 considerably increases compared with the case without the micro lens 40. In particular, the light emission amount of red light considerably increases, by about twice.

TABLE 1

|  | with Micro Lens | without Micro Lens |
|---|---|---|
| Loss in Compound Semiconductor Layer | 25.2% | 37.2% |
| Loss in Transparent Portion | 5.8% | 15.6% |
| Loss in Lens | 6.4% | 0% |
| External Emission | 62.3% | 46.4% |
| Total | 99.8% | 99.2% |

TABLE 2

|  | with Micro Lens | without Micro Lens |
|---|---|---|
| Loss in Compound Semiconductor Layer | 14.6% | 31.4% |
| Loss in Red Wavelength Conversion Portion | 14.6% | 35.2% |
| Loss in Lens | 4.2% | 0% |
| External Emission | 66.4% | 32.8% |
| Total | 99.8% | 99.4% |

However, the effect of the micro lens 40 on the emission angle distribution considerably differs between a case of blue light where excitation light itself is emitted to the outside of the blue subpixel 6 and a case of red light where red light is generated by using a red wavelength conversion portion 32f. In the case of blue light, light emitted at an emission angle in the range of 20 degrees or larger and 60 degrees or smaller increases due to the micro lens 40, while, in the case of red light, light emission amount considerably increases around the emission angle of 70 degrees. The distribution chart 1203 of FIG. 12 shows the distribution of positions from which red light is emitted at an emission angle of 65 degrees or larger and 75 degrees or smaller. It can be seen that, in this case, most of red light is emitted from the outer peripheral part of the micro lens 40.

From this result, it can be easily estimated that the effect of the reflection surface 34Sc of the partition wall 34c is larger for red light than for blue light. That is, a full color display device such as the image display device 200f should be designed so that the shape of the partition wall 34c can maximize the effect for red light. In an example shown in the graph 1202 of FIG. 12, because it is considered that light emitted at an emission angle of 70 degrees is desirably parallel to the center line of the micro lens 40, the inclination angle θw of the reflection surface 34Sc may be 55 degrees.

An emission angle distribution in a case where the reflection surface 34Sc satisfying the above conditions is provided is simulated. The graph 1204 of FIG. 12 shows a case for blue light, and the graph 1205 of FIG. 12 shows a case for red light. The height of the partition wall 34c is equal to the radius of the micro lens 40, and D=0. Table 3 shows the amount of external emission of blue light and red light at an emission angle of 40 degrees or smaller. As shown in Table 3, with the reflection surface 34Sc, external emission light increases in a region of small emission angles. The effect is 18% increase for blue light, and 120% increase for red light. Thus, with the reflection surface 34Sc, the amount of light emitted from the micro light emitting element in the center line direction of the micro lens 40 can be considerably increased. Also for the green light, an effect similar to that for red light can be expected.

TABLE 3

|  | Without Reflection Surface | With Reflection Surface |
|---|---|---|
| Blue Light | 25.4% | 30.0% |
| Red Light | 16.2% | 35.6% |

In order to improve the brightness in the forward direction of a micro light emitting element 100f, the contact angle θc of the micro lens 40 is important. As illustrated in FIG. 3, the contact angle θc is the angle between the bottom part of the micro lens 40 and the surface of the micro lens 40. To be specific, when the surface of the micro lens 40 is a spherical surface, θc=90 degrees if the center of the micro lens 40 is in the light emitting surface, and θc decreases as the center moves downward from the light emitting surface.

The graph 1206 of FIG. 12 illustrates a result of simulating the dependency, on θc, of light extraction efficiency at an emission angle of 40 degrees or smaller and of light extraction efficiency without the reflection surface 34Sc. As θc decreases, the light extraction efficiency from the micro lens 40 to the outside decreases. On the other hand, although light extraction efficiency at an emission angle of 40 degrees or smaller decreases, the light extraction efficiency is substantially constant when θc≥74 degrees. Thus, in order to improve the brightness in the forward direction of the micro light emitting element, the contact angle θc may be maintained at 74 degrees or larger.

Also with the present embodiment, advantageous effects similar to those of the first embodiment can be realized.

Eighth Embodiment

Figure 13:
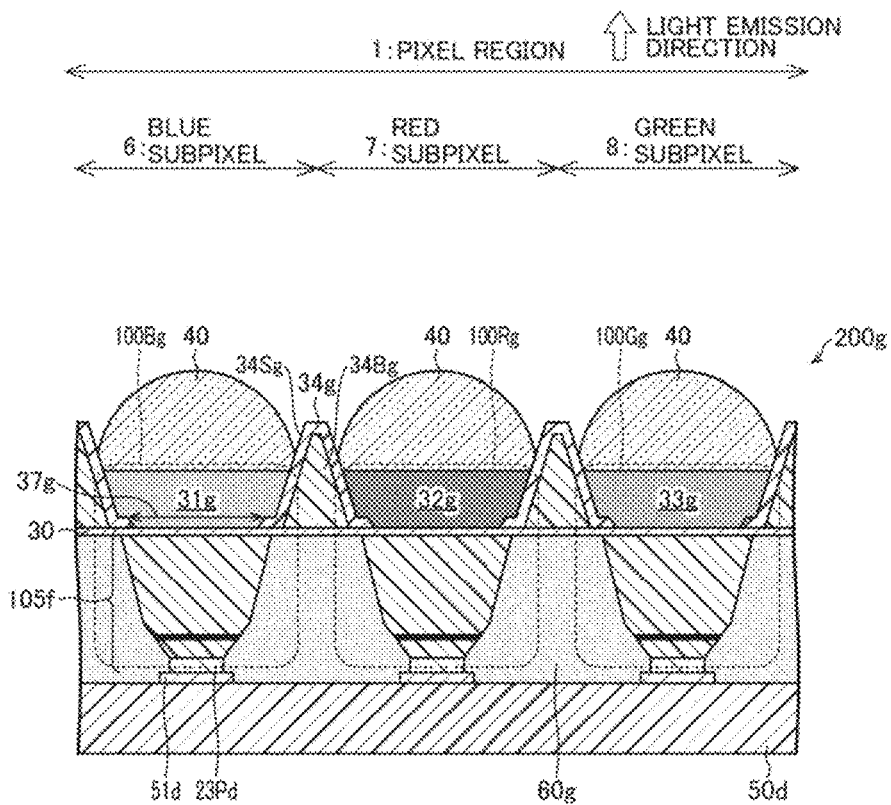
FIG. 13 is a schematic sectional view of a pixel region of an image display device according to an eighth embodiment of the present disclosure.

Referring to FIG. 13, another embodiment of the present disclosure will be described. An image display device 200g according to the present embodiment is a full color display device similar to the image display device 200f according to the seventh embodiment. The difference is that a wavelength conversion portion is disposed in a partition wall 34g, and a micro lens 40 is placed thereon.

As described in the seventh embodiment, the light extraction efficiency from the wavelength conversion portion can be improved by forming the side wall of the wavelength conversion portion so as to open in the light emission direction. In order to reflect light emitted from the outer peripheral part of the micro lens 40 at a large emission angle toward the center line direction of the micro lens 40, it is necessary to form a reflection surface 34Sg of the partition wall 34g so as to open in the light emission direction. Accordingly, light extraction efficiency can be improved by disposing the wavelength conversion portion, in addition to the micro lens 40, inside of the partition wall 34g, and light emission efficiency can be improved by reinforcing light output in the forward direction of the micro light emitting element. In the present specification, a blue micro light emitting element 100Bg, a red micro light emitting element 100Rg, and a green micro light emitting element 100Gg may be collectively referred to as "micro light emitting element".

As illustrated in FIG. 13, the height of the partition wall 34g in the center line direction may be smaller than or equal to the height of the micro lens 40 in the center line direction. As shown in the graph 406 of FIG. 4, it is considered that the light extraction efficiency of light emitted in the center line direction of the micro lens 40 increases as the height of the partition wall 34g increases. However, when the height of the partition wall 34g is increased, the size of the light emitting surface is reduced. Due to reduction of the size of the light emitting surface, the light emission efficiency may decrease. As the height of the partition wall 34g decreases, it becomes easier to manufacture the image display device. Accordingly, the optimum value of the height of the partition wall 34g may be selected by comparing the positive effect of increasing the height of the partition wall 34g with the negative effect of reducing the size of the light emitting surface.

In the present embodiment, the structure in which the blue micro LED 105f, which is the excitation light source, is disposed on the driving circuit substrate 50d is similar to that of the seventh embodiment. The structure in which a partition wall body 34Bg is disposed on the common N-electrode 30 and a partition wall reflector (forming the reflection surface 34Sg) is disposed thereon is similar to that of the fourth embodiment shown in FIG. 7. In FIG. 7, the opening 37 of the partition wall reflector 36 completely covers the light emitting surface 101 of the micro light emitting element 100. In the present embodiment, the opening 37g covers a part of the upper surface of the blue micro LED 105f. This is in order to suppress light leakage from the wavelength conversion portion toward the driving circuit substrate 50d when an embedding material 60g does not have light blocking ability. Also with the present embodiment, advantageous effects similar to those of the first embodiment can be realized.

Ninth Embodiment

Figure 14:
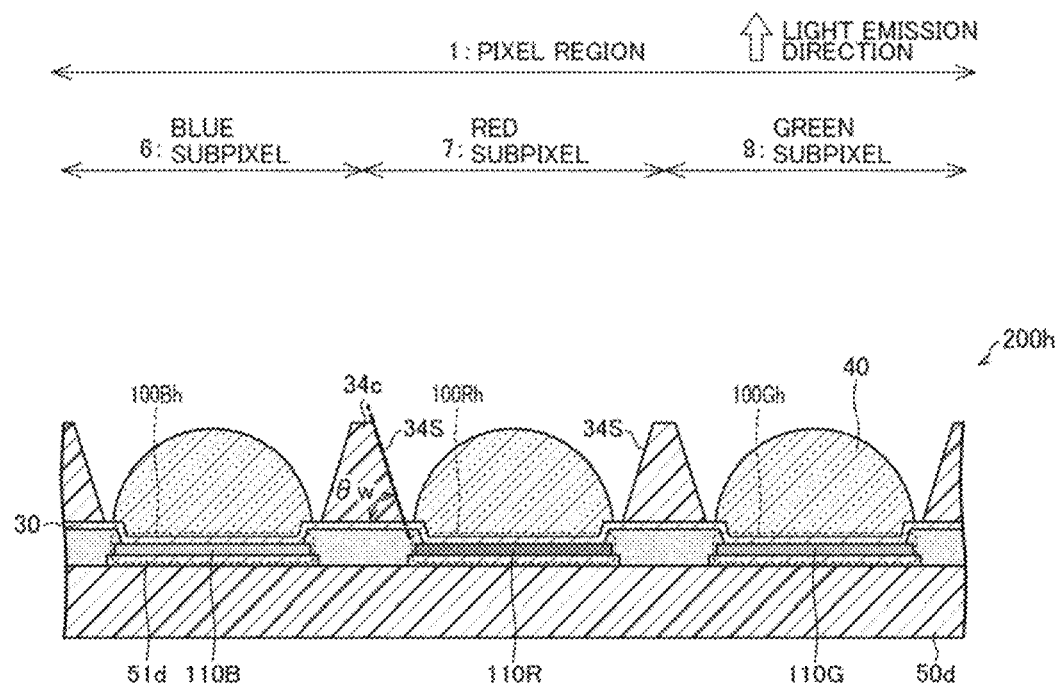
FIG. 14 is a schematic sectional view of a pixel region of an image display device according to a ninth embodiment of the present disclosure.
Figure 15:
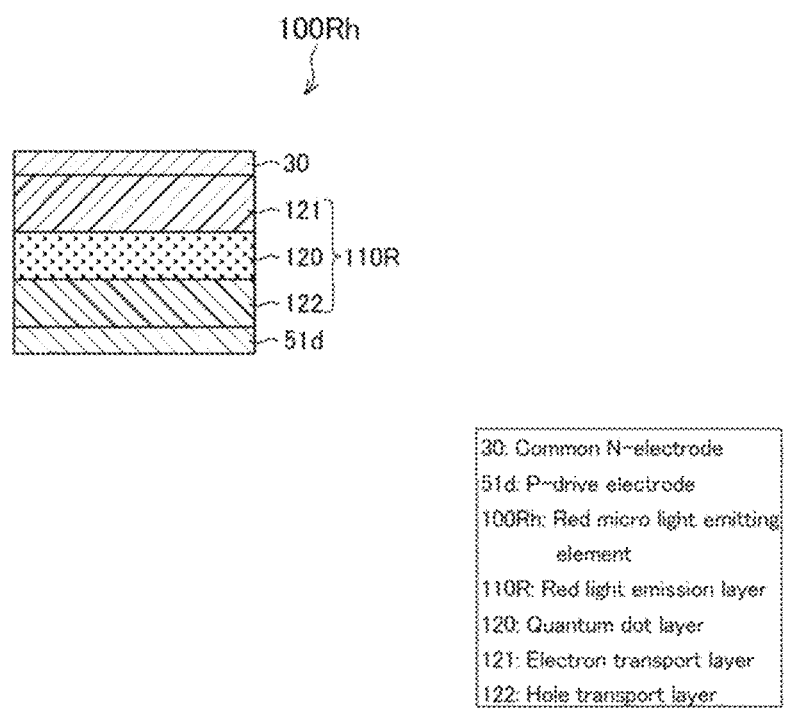
FIG. 15 is a schematic sectional view of a red light micro light emitting element of the image display device according to the ninth embodiment of the present disclosure.

Referring to FIGS. 14 and 15, another embodiment of the present disclosure will be described. An image display device 200h according to the present embodiment is a full color display device similar to the image display device 200f according to the seventh embodiment. The image display device 200h differs from the image display device 200f in that a quantum dot light-emitting diode (QLED) is used as a micro light emitting element. In the present embodiment, a red micro light emitting element 100Rh is composed of a P-drive electrode 51d (first electrode), a red light emission layer 110R formed thereon, and a common N-electrode 30 (second electrode) formed thereon.

As illustrated in FIG. 15, in the red light emission layer 110R, an electron transport layer 121 and a hole transport layer 122 are disposed on both sides of a quantum dot layer 120. The red light emission layer 110R is caused to emit light by injecting electrons and holes respectively from the electron transport layer 121 and the hole transport layer 122 and causing the electrons and the holes to recombine in the quantum dot layer 120. The wavelength of emitted light can be controlled by changing the core size of the quantum dot. Accordingly, a blue micro light emitting element 100Bh and a green micro light emitting element 100Gh each can be formed from a QLED in the same way. Hereafter, the light emission layers 110R, 110B, and 110G may be simply referred to as "light emission layer 110" when it is not necessary to discriminate between colors. The details of the configuration of the QLED, which is not directly related to the essence of the present disclosure, will not be described in the present specification.

The common N-electrode 30 is a transparent conductive film. The surface of the P-drive electrode 51d may have high reflectivity for visible light. The light emitting surface in the present embodiment is composed of surfaces of the emission layers 110B, 110R, and 110G. It is possible to invert the polarity of the QLED by disposing the electron transport layer 121 on the driving circuit substrate 50d side and disposing the hole transport layer 122 on the light emitting surface side. In this case, the first electrode is an N-electrode, and the second electrode is a common P-electrode.

In the example illustrated in FIG. 4, the micro lens 40 made of a transparent resin is disposed on the compound semiconductor layer 14 having a refractive index of about 2.4. In the graph 1202 of FIG. 12, the micro lens 40 made of a transparent resin is disposed on the wavelength conversion portion having a refractive index of about 1.6. In both of these cases, the light extraction efficiency is considerably improved by the micro lens 40. Thus, even if the refractive index of the light emitting surface changes considerably, improvement of light extraction efficiency can be realized by the micro lens 40. Although it is not possible to accurately measure the refractive index of the light emitting surface of the QLED, it is estimated, from the quantum dot material and the refractive index of resin layers constituting the electron transport layer 121 and the hole transport layer 122, that the refractive index of the light emitting surface does not differ considerably from those of examples shown in FIG. 4 and FIG. 12. Accordingly, also with the present embodiment using the QLED, advantageous effects similar to those of the micro lens 40 can be expected.

The partition wall 34c may be used as a part of N-electrode wiring, because the partition wall 34c is made of a metal and is directly in contact with the common N-electrode 30 in a pixel as illustrated in FIG. 14. In particular, in order to reduce light absorption by the common N-electrode 30, it is necessary to reduce the thickness of the common N-electrode 30, and the electric resistance of the common N-electrode 30 increases. Increase of electric resistance on the N-electrode side can be suppressed by using the partition wall 34c as a part of wiring of the common N-electrode 30. Also with the present embodiment, light leakage to an adjacent micro light emitting element can be suppressed by disposing the micro lens 40 so as to cover the light emitting surface and further disposing the partition wall 34c.

Modification

As a modification of the ninth embodiment, each of the light emission layers 110B, 110R, and 110G may be replaced with, instead of a QLED, an organic light-emitting diode (OLED). An OLED has, as with a QLED, a configuration such that a light emission layer is disposed between the electron transport layer 121 and the hole transport layer 122.

Tenth Embodiment

Referring to FIG. 16, another embodiment of the present disclosure will be described. In an image display device 200i according to the present embodiment, a QLED is used as a micro light emitting element, as with the ninth embodiment. However, the present embodiment differs from the ninth embodiment in that the micro light emitting element includes a P-electrode 23Pi (first electrode) having a recessed portion. In other words, the P-electrode 23Pi has a recessed shape that is recessed toward a side opposite from the light emitting surface side of the micro light emitting element. The light emission layers 110B, 110R, and 110G are each disposed inside of the recessed portion of the P-electrode 23Pi. It is possible to invert the polarity of the QLED by disposing the electron transport layer 121 on the driving circuit substrate 50d side and disposing the hole transport layer 122 on the light emitting surface side. In this case, the first electrode is an N-electrode, the second electrode is a common P-electrode, and the N-electrode has a recessed shape.

As illustrated in FIG. 16, a side wall 23S formed in the recessed portion of the P-electrode 23Pi is inclined at an inclination angle θq less than 90 degrees with respect to the driving circuit substrate 50d. θq may be 30 degrees or larger and 60 degrees or smaller. The surface of the P-electrode 23Pi is made of a highly reflective metal material.

The QLED emits light also in the horizontal direction in FIG. 16, because the QLED isotropically emits light. By reflecting the light, which propagates in the horizontal direction, upward, light leakage to an adjacent micro light emitting element is suppressed, and light extraction efficiency can be improved. The light emission layer 110 may be in contact with the side wall 23S. However, the light emission layer 110 may be disposed on the bottom part of the recessed portion of the P-electrode 23Pi, and may not directly in contact with the side wall 23S. A transparent insulating film 18 may be disposed between a side wall of the light emission layer 110 and the side wall 23S. In this case, light that is horizontally emitted from the light emission layer 110 passes through the transparent insulating film 18, is reflected by the side wall 23S, and is emitted upward. Therefore, a light emitting surface 101i is the opening of the recessed portion of the P-electrode 23Pi.

The micro lens 40 is formed so as to cover the light emitting surface 101i. The partition wall 34c is disposed around the micro lens 40. In this respect, the present embodiment is similar to the first embodiment.

The present embodiment differs from the other embodiments in the following respects: in the image display device 200i, a region around the P-electrode 23Pi in a direction parallel to the light emitting surface is covered with a first insulating film 19; and a region around the common N-electrode 30 in the direction parallel to the light emitting surface is covered with a second insulating film 20.

A method of manufacturing the image display device 200i according to the present embodiment will be described. The first insulating film 19 is formed on the driving circuit substrate 50d, and an opening is formed in the P-drive electrode 51d. The inclination angle of a side wall of the opening is controlled to be θq. A highly reflective thin metal, which to become a P-electrode, is deposited thereon, and the film is processed as the P-electrode 23Pi in which a recessed portion is formed.

The first insulating film 19 may be an inorganic insulating film made of $SiO_2$, SiN, or the like, or may be a resin film made of polyimide, silicone, or the like. A highly reflective metal that is the material of the P-electrode 23Pi contains silver or aluminum. Next, the light emission layer 110 is successively formed. The material of the light emission layer 110 may be directly applied and patterned, or the light emission layer 110 may be formed on another layer and then stamp-transferred onto the P-electrode 23Pi. Next, the transparent insulating film 18 is formed. Further, an opening is formed in the light emission layer 110 by forming the second insulating film 20, and the common N-electrode 30 is formed. The transparent insulating film 18 and the second insulating film 20, both of which are transparent insulating films, may be simultaneously formed. The common N-electrode 30 is a transparent conductive film. A method of forming the micro lens 40 and the partition wall 34c is similar to that of the first embodiment. Also with the present embodiment, advantageous effects similar to those of the first embodiment can be realized by disposing the micro lens 40 so as to cover the light emitting surface 101i and further by disposing the partition wall 34c.

Eleventh Embodiment

Referring to FIG. 17, another embodiment of the present disclosure will be described. An image display device 200j according to the present embodiment is similar to the seventh embodiment illustrated in FIG. 11, but differs from the seventh embodiment in that the functions of a wavelength conversion portion and a micro lens are integrated.

A red micro light emitting element 100Rj (micro light emitting element) in the present embodiment is composed of a blue micro LED 105f (micro LED) and a red wavelength conversion portion 41 (wavelength conversion portion) disposed on the upper surface of the blue micro LED 105f.

The red wavelength conversion portion 41 has a shape (for example, a dome shape) including a curved surface that is convex in the light emission direction, as with the micro lens 40 in other embodiments. However, the red wavelength conversion portion 41 differs from the micro lens 40 in that the red wavelength conversion portion 41 includes a wavelength conversion material that down-converts blue light into red light.

The red wavelength conversion portion 41 is, for example, a transparent resin in which a wavelength conversion material that emits red light, such as a quantum dot, a quantum rod, a phosphor, or a dye, is dispersed. Likewise, in a green micro light emitting element 100Gj, a green wavelength conversion portion 42 having a dome shape is disposed on the blue micro LED 105f. A blue micro light emitting element 100Bj includes a transparent micro lens 40, as with the other embodiments. This is because it is not necessary to perform wavelength conversion of light emitted from the blue micro LED 105f.

The partition wall 34c is disposed around the micro lens 40, the red wavelength conversion portion 41, and the green wavelength conversion portion 42. The bottom surfaces of the micro lens 40, the red wavelength conversion portion 41, and the green wavelength conversion portion 42 cover the openings 37 of a partition wall reflector (forming a reflection surface 34Sj).

In FIG. 17, the partition wall reflector covers a part of a light emitting surface 102 of the blue micro LED 105f. However, the opening 37 may completely cover the light emitting surface 102. In other words, the partition wall reflector need not cover a part of the light emitting surface 102. This is because, when the embedding material 60 has light blocking ability, light leakage to an adjacent micro light emitting element is small, even if the opening 37 completely covers the light emitting surface 102.

It is not necessary that the concentration distribution of the wavelength conversion material in the red wavelength conversion portion 41 be uniform. For example, a layer in which the concentration of the wavelength conversion material is high may be disposed in a bottom part of the red wavelength conversion portion 41, and a layer in which the concentration of the wavelength conversion material is low may be disposed in an upper part of the red wavelength conversion portion 41. Alternatively, a layer in which the concentration of the wavelength conversion material is high may disposed in a central part of the red wavelength conversion portion 41, and the concentration of the wavelength conversion material may decrease outward from the central part. The arrangement of the concentrations of the wavelength conversion material may be opposite to the arrangement described above. The same applies to the green wavelength conversion portion 42.

The effect of the micro lens 40 and the partition wall 34c in the blue micro light emitting element 100Bj is similar to that of the first embodiment. The surface of an outer peripheral part of the red wavelength conversion portion 41, having a dome shape, has a substantially vertical inclination.

In the red wavelength conversion portion 41, light emitted at an emission angle close to the horizontal direction is easily emitted from the outer peripheral part of the red wavelength conversion portion 41 having a substantially vertical inclination. Because the outer peripheral part of the red wavelength conversion portion 41 has the largest diameter, the amount of light emitted at an angle close to the horizontal direction is large, and therefore the present embodiment does not differ from the seventh embodiment in that a large amount of light is emitted from the outer peripheral part at a large emission angle. Accordingly, with the present embodiment, effects similar to those of the seventh embodiment occur. The same applies to the green micro light emitting element 100Gj.

As described above, the partition wall 34c is disposed around the red wavelength conversion portion 41 (the green wavelength conversion portion 42) in the direction parallel to the light emitting surface 102, the shape of the red wavelength conversion portion 41 (the green wavelength conversion portion 42) is a shape including a curved surface that is convex in the light emission direction, and a side surface of the partition wall 34c facing the red wavelength conversion portion 41 (the green wavelength conversion portion 42) is inclined so as to open in the light emission direction and serves as a reflection surface that reflects light. Thus, light leakage to an adjacent micro light emitting element is suppressed, light emitted at a large emission angle is reflected toward the center line direction of the micro lens 40 and the like, and thus the intensity of light emitted in the center line direction can be increased.

Twelfth Embodiment

Referring to FIG. 18, another embodiment of the present disclosure will be described. An image display device 200k according to the present embodiment is similar to the image display device 200e according to the sixth embodiment illustrated in FIG. 9, but differs from the image display device 200e in that, in the red subpixel 7 and the green subpixel 8, a dielectric multilayer film 45 is disposed on the light emitting surface of the micro lens 40 that emits light.

As described above, the emission amounts of down-converted red light and green light increase by providing the micro lenses 40 on the light emitting surface 101R of the micro light emitting element 100R and the light emitting surface 101G of the micro light emitting element 100G. At this time, the emission amount of blue light, which is excitation light, also increases.

When the absorbance (optical density) of blue light by the red wavelength conversion portion 32 and the green wavelength conversion portion 33 is not sufficiently large, blue light, which is excitation light, is emitted from the red subpixel 7 and the green subpixel 8, and the color purity of red light and green light emitted from these subpixels decreases. Emission of excitation light from the red subpixel 7 and the green subpixel 8 can be reduced and color purity can be improved by disposing, on the surface of the micro lens 40, the dielectric multilayer film 45 that reflects excitation light and transmits down-converted red light and green light. Also with the present embodiment, advantageous effects similar to those of the first embodiment can be realized by disposing the micro lens 40 so as to cover the light emitting surface and further disposing the partition wall 34c.

Thirteenth Embodiment

Figure 19:
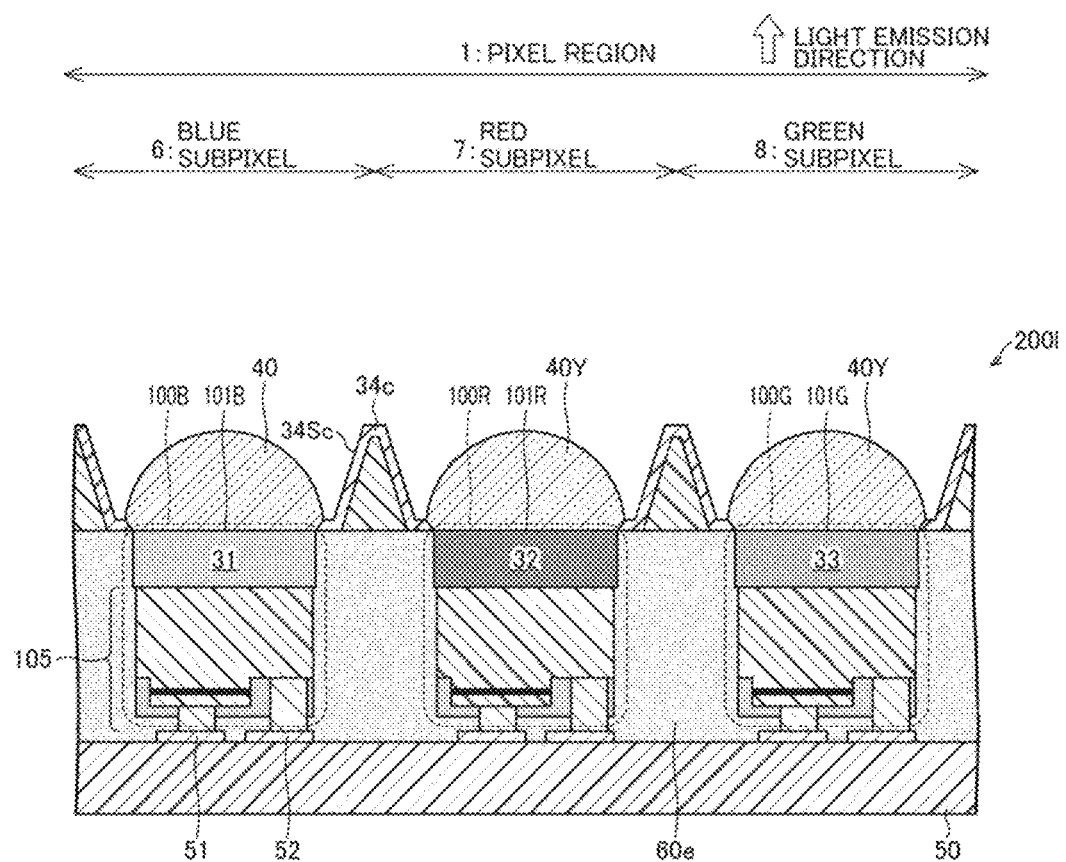
FIG. 19 is a schematic sectional view of a pixel region of an image display device according to a thirteenth embodiment of the present disclosure.

Referring to FIG. 19, another embodiment of the present disclosure will be described. An image display device 200l according to the present embodiment is similar to the image display device 200e according to the sixth embodiment illustrated in FIG. 9, but differs from the image display device 200e in that, in each of the red subpixel 7 and the green subpixel 8, an excitation-light-absorbing-material-containing micro lens 40Y, which includes a blue light absorbing material (filter material), is disposed instead of the micro lens 40.

As described above in the twelfth embodiment, there may be a case where it is necessary to prevent emission of blue light (excitation light) from the red subpixel 7 and the green subpixel 8. In such a case, emission of blue light from the red subpixel 7 and the green subpixel 8 can be reduced by using, for example, a micro lens such as the excitation-light-absorbing-material-containing micro lens 40Y, which includes a dye (filter material or the like) that absorbs blue light and does not absorb red light and green light. Even when such a blue light absorbing material is included in the excitation-light-absorbing-material-containing micro lens 40Y, the effects of the excitation-light-absorbing-material-containing micro lens 40Y and the partition wall 34c are not impaired, because the blue light absorbing material does not considerably affect red light and green light. Also with the present embodiment, advantageous effects similar to those of the first embodiment can be realized by disposing the excitation-light-absorbing-material-containing micro lens 40Y so as to cover the light emitting surface and by further disposing the partition wall 34c.

SUMMARY

An image display device according to a first aspect of the present disclosure includes: a plurality of micro light emitting elements arranged in an array shape; a driving circuit substrate including a driving circuit that supplies electric currents to the plurality of micro light emitting elements and that causes the plurality of micro light emitting elements to emit light; a plurality of micro lenses in contact with light emitting surfaces of the plurality of micro light emitting elements; and a plurality of partition walls disposed around the plurality of micro lenses in a direction parallel to the light emitting surfaces. A side surface of each of the plurality of partition walls facing a corresponding one of the plurality of micro lenses is inclined so as to open in a light emission direction and is a reflection surface that reflects light.

With this configuration, the partition wall is disposed around the micro lens in the direction parallel to the light emitting surface. Therefore, light leakage to an adjacent micro light emitting element can be suppressed. With this configuration, the side surface of the partition wall facing the micro lens is inclined so as to open in the light emission direction and is the reflection surface that reflects light. Therefore, the path of light that is emitted from the micro lens is reflected by the reflection surface and changed in a direction that is substantially parallel to the forward direction of the micro light emitting element. Therefore, light output in the forward direction of the micro light emitting element is reinforced, and thus light emission efficiency can be improved.

In an image display device according to a second aspect of the present disclosure, in the first aspect, the micro light emitting elements may be micro LEDs including a compound semiconductor crystal.

In an image display device according to a third aspect of the present disclosure, in the first aspect, bottom surfaces of the plurality of micro lenses may cover the entirety of the light emitting surfaces of the plurality of micro light emitting elements.

In an image display device according to a fourth aspect of the present disclosure, in the first aspect, the inclination angle of the reflection surface may be 85 degrees or smaller.

In an image display device according to a fifth aspect of the present disclosure, in the first aspect, the surface of each of the micro lenses may be a spherical surface, and the center of the spherical surface may be within ±1 μm with respect to the center of the light emitting surface.

In an image display device according to a sixth aspect of the present disclosure, in any one of the first to fifth aspects, the plurality of partition walls may be formed in contact with a surface of the driving circuit substrate. The configuration described above can be used in a case where the pixel pitch is large and the space between the micro light emitting elements can be made large. With this configuration, because the height of the partition wall is large, the partition wall may be formed beforehand by using a mold and then may be affixed onto the driving circuit substrate.

In an image display device according to a seventh aspect of the present disclosure, in any one of the first to sixth aspects, a shape of each of the plurality of partition walls as seen from the light emitting surface side of the plurality of micro light emitting elements may be rectangular.

In image display device according to an eighth aspect of the present disclosure, in any one of the first to seventh aspects, the plurality of partition walls may each include a partition wall body that is made of a transparent material and a partition wall reflector that covers the partition wall body and that is made of a highly reflective metal film.

In order to form a partition wall from a single reflector, it is necessary to deposit a metal film having a height larger than or equal to the height of the partition wall and process the metal film into a partition wall having an inclined surface by using a photolithography method or a dry etching technology. Because the height of the partition wall may be as large as several micrometers, it is necessary to deposit a very thick metal film. However, there is a problem in that such a thick metal film generally has a large surface roughness and it is difficult to precisely align the metal film with an underlying layer. Moreover, because it is desirable that the bottom part of the side wall do not cover the light emitting surface, as the pixel size of the image display device decreases, it becomes more necessary to precisely align the partition wall with the light emitting surface. Thus, the above problem can be avoided by forming the partition wall body from a transparent material, which can be aligned precisely and easily, and by covering the surface of the partition wall body with the partition wall reflector.

In an image display device according to a ninth aspect of the present disclosure, in any one of the first to eighth aspects, each of the plurality of micro light emitting elements may include a first electrode on a surface of the micro light emitting element opposite from the light emitting surface and a second electrode on the light emitting surface side of the micro light emitting element. With this configuration, it is easy to reduce the size of the micro light emitting element, because it is not necessary to provide both of the first electrode and the second electrode on the surface opposite from the light emitting surface.

In an image display device according to a tenth aspect of the present disclosure, in the ninth aspect, the plurality of partition walls may each include a part of wiring that is electrically connected to the second electrode. With this configuration, increase of the resistance on the second electrode side can be suppressed by using the partition wall as a part of wiring of the second electrode.

In an image display device according to an eleventh aspect of the present disclosure, in any one of the first to tenth aspects, each of the plurality of micro light emitting elements may include a micro LED including a compound semiconductor crystal and a wavelength conversion portion that increases a wavelength of excitation light emitted by the micro LED, and the light emitting surface may be an upper surface of the wavelength conversion portion.

In an image display device according to a twelfth aspect of the present disclosure, in any one of the first to tenth aspects, each of the plurality of micro light emitting elements may include a micro LED including a compound semiconductor crystal and a transparent portion disposed on the micro LED, and the light emitting surface may be an upper surface of the transparent portion.

In an image display device according to a thirteenth aspect of the present disclosure, in the eleventh aspect, a surface of a side wall of the wavelength conversion portion in the direction parallel to the light emitting surface may be a surface that is inclined so as to open in the light emission direction. The light extraction efficiency from the wavelength conversion portion can be improved by inclining the side wall of the wavelength conversion portion so as to open in the light emission direction.

In an image display device according to a fourteenth aspect of the present disclosure, in the twelfth aspect, a surface of a side wall of the transparent portion in the direction parallel to the light emitting surface may be a surface that is inclined so as to open in a light emission direction. The light extraction efficiency from the transparent portion can be improved by inclining the side wall of the transparent portion so as to open in the light emission direction.

In an image display device according to a fifteenth aspect of the present disclosure, in the eleventh or thirteenth aspect, a side wall of the wavelength conversion portion in the direction parallel to the light emitting surface may be covered with a highly reflective metal film. With this configuration, the light extraction efficiency of the micro light emitting element can be further improved, compared with a case where the side all of the wavelength conversion portion is not covered with the highly reflective metal film.

In an image display device according to a sixteenth aspect of the present disclosure, in the twelfth or fourteenth aspect, a side wall of the transparent portion in a direction parallel to the light emitting surface may be covered with a highly reflective metal film. With this configuration, the light extraction efficiency of the micro light emitting element can be further improved, compared with a case where the side all of the transparent portion is not covered with the highly reflective metal film.

In an image display device according to a seventeenth aspect of the present disclosure, in the eleventh, thirteenth, or fifteenth aspect, the wavelength conversion portion may be disposed inside of each of the plurality of partition walls, and the wavelength conversion portion and a corresponding one of the plurality of micro lenses may be stacked in this order.

As described above, the light extraction efficiency from the wavelength conversion portion can be improved by inclining the side wall of the wavelength conversion portion so as to open in the light emission direction. On the other hand, in order to reflect light emitted from the outer peripheral part of the micro lens at a large emission angle toward the center line direction, it is necessary to form the reflection surface of the partition wall so as to open in the light emission direction. Accordingly, light extraction efficiency can be improved by disposing the wavelength conversion portion and the micro lens inside of the partition wall, and light emission efficiency can be improved by reinforcing light output in the forward direction of the micro light emitting element.

In an image display device according to an eighteenth aspect of the present disclosure, in the eleventh aspect, the reflection surface may cover a periphery of the wavelength conversion portion in the direction parallel to the light emitting surface.

In an image display device according to a nineteenth aspect of the present disclosure, in the first aspect, the height of the reflection surface in the center line direction may be smaller than or equal to the height of the micro lens in the center line direction.

In an image display device according to a twentieth aspect of the present disclosure, in the first aspect, the plurality of micro light emitting elements may be a plurality of quantum dot LEDs each of which includes a quantum dot layer including a quantum dot and emits light when electricity is supplied to the quantum dot layer.

In an image display device according to a twenty-first aspect of the present disclosure, in the first aspect, the plurality of the micro light emitting elements may be a plurality of organic LEDs.

In an image display device according to a twenty-second aspect of the present disclosure, in the ninth aspect, the first electrode may have a recessed shape that is recessed toward a side opposite from the light emitting surface side. The micro light emitting element emits light also in the horizontal direction, because the micro light emitting element isotropically emits light. By reflecting the light, which is emitted in the horizontal direction, upward, light leakage to an adjacent micro light emitting element is suppressed, and light extraction efficiency can be improved.

In an image display device according to a twenty-third aspect of the present disclosure, in the eleventh aspect, a plurality of dielectric multilayer films that reflect the excitation light and that transmit the light whose wavelength has been increased may be disposed on light emitting surfaces of the plurality of micro lenses that emit light. With this configuration, emission of excitation light from micro light emitting elements that emit red light and green light can be reduced, and the color purity can be improved.

In an image display device according to a twenty-fourth aspect of the present disclosure, in the eleventh aspect, the plurality of micro lenses may include a filter material that absorbs the excitation light and transmits the light whose wavelength has been increased. With this configuration, emission of excitation light from the micro light emitting element can be reduced.

An image display device according to a twenty-fifth aspect of the present disclosure includes: a plurality of micro light emitting elements arranged in an array shape; a driving circuit substrate including a driving circuit that supplies electric currents to the plurality of micro light emitting elements and that causes the plurality of micro light emitting elements to emit light; a plurality of wavelength conversion portions that increase wavelength of excitation light emitted by the plurality of micro light emitting elements; and a plurality of partition walls disposed around the plurality of wavelength conversion portions in a direction parallel to light emitting surfaces of the plurality of micro light emitting elements. The driving circuit substrate, plurality of micro light emitting elements, and the plurality of wavelength conversion elements are stacked in this order. The plurality of wavelength conversion portions each have a shape including a curved surface that is convex in a light emission direction. A side surface of each of the plurality of partition walls facing a corresponding one of the plurality of wavelength conversion portions is inclined so as to open in the light emission direction and is a reflection surface that reflects light. With this configuration, light emission efficiency can be improved by reinforcing light output in the forward direction of the micro light emitting element.

Other Expressions of Present Disclosure

The present disclosure may be expressed as follows. That is, an image display device according to an aspect of the present disclosure may include: micro light emitting elements that are arranged in an array shape; a driving circuit substrate on which the micro light emitting elements are arranged, the driving circuit substrate including a driving circuit that supplies electric currents to the micro light emitting elements and causes the micro light emitting elements to emit light; and micro lenses disposed on light emitting surfaces of the micro light emitting elements; and partition walls disposed around the micro lenses. A side surface of each of the partition walls facing a corresponding one of the micro lenses is a reflection surface that is inclined so as to open in the light emission direction.

In an image display device according to an aspect of the present disclosure, each of the micro light emitting elements may include a micro LED including a compound semiconductor crystal and a wavelength conversion portion that down-converts excitation light emitted by the micro LED, and the light emitting surface may be an upper surface of the wavelength conversion portion.

In an image display device according to an aspect of the present disclosure, each of the micro light emitting elements may include a micro LED including a compound semiconductor crystal and a transparent portion disposed on the micro LED, and the light emitting surface may be an upper surface of the transparent portion.

In an image display device according to an aspect of the present disclosure, the micro light emitting elements may be quantum dot LEDs each of which emits light when electricity is supplied to a quantum dot layer.

In an image display device according to an aspect of the present disclosure, the micro light emitting elements may be organic LEDs.

An image display device according to an aspect of the present disclosure may include: micro LEDs that are arranged in an array shape; a driving circuit substrate on which the micro LEDs are arranged, the driving circuit substrate including a driving circuit that supplies electric currents to the micro LEDs and causes the micro LEDs to emit light; wavelength conversion portions each of which down-converts excitation light emitted by a corresponding one of the micro LEDs; and partition walls disposed around the wavelength conversion portions. Each of the wavelength conversion portions has a dome-shape. A side wall of each of the partition walls facing a corresponding one of the wavelength conversion portions is a reflection surface that is inclined so as to open in a light emission direction.

In an image display device according to an aspect of the present disclosure, a dielectric multilayer film that reflects the excitation light and that transmits the down-converted light may be disposed on a surface of the micro lens.

In an image display device according to an aspect of the present disclosure, the micro lens may include a filter material that absorbs the excitation light and that transmits the down-converted light.

In an image display device according to an aspect of the present disclosure, the partition wall may include a part of wiring that is electrically connected to one of electrodes of the micro light emitting element.

In an image display device according to an aspect of the present disclosure, a side wall of the wavelength conversion portion may be inclined so as to open in the light emission direction.

In an image display device according to an aspect of the present disclosure, the reflection surface may surround the periphery of the wavelength conversion portion.

In an image display device according to an aspect of the present disclosure, the inclination angle of the reflection surface may be 85 degrees or smaller.

In an image display device according to an aspect of the present disclosure, the height of the reflection surface may be smaller than or equal to the height of the micro lens.

In an image display device according to an aspect of the present disclosure, the micro lens may cover the entirety of the light emitting surface.

In an image display device according to an aspect of the present disclosure, the surface of the micro lens is a spherical surface, and the center of the spherical surface may be within ±1 μm with respect to the center of the light emitting surface.

The present disclosure contains subject matter related to that disclosed in Japanese Priority Patent Application JP 2019-125201 filed in the Japan Patent Office on Jul. 4, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image display device comprising:
   a plurality of micro light emitting elements arranged in an array shape;
   a driving circuit substrate including a driving circuit that supplies electric current to the plurality of micro light emitting elements and that causes the plurality of micro light emitting elements to emit light;
   a plurality of micro lenses in contact with light emitting surfaces of the plurality of micro light emitting elements; and
   a plurality of partition walls disposed around the plurality of micro lenses in a direction parallel to the light emitting surfaces,
   wherein a side surface of each of the plurality of partition walls facing a corresponding one of the plurality of micro lenses is inclined so as to open in a light emission direction and is a reflection surface that reflects light and is not in contact with a corresponding one of a plurality of surfaces of the plurality of micro lenses, and
   wherein each of the plurality of micro light emitting elements includes a micro light emitting diode including a compound semiconductor crystal and a transparent portion disposed on the micro light emitting diode, and the light emitting surface is an upper surface of the transparent portion.

2. The image display device according to claim 1, wherein bottom surfaces of the plurality of micro lenses cover the entirety of the light emitting surfaces of the plurality of micro light emitting elements.

3. The image display device according to claim 1, wherein the plurality of partition walls are formed in contact with a surface of the driving circuit substrate.

4. The image display device according to claim 1, wherein a shape of each of the plurality of partition walls as seen from the light emitting surface side of the plurality of micro light emitting elements is rectangular.

5. The image display device according to claim 1, wherein the plurality of partition walls each include a partition wall body that is made of a transparent material and a partition wall reflector that covers the partition wall body and that is made of a highly reflective metal film.

6. The image display device according to claim 1, wherein each of the plurality of micro light emitting elements includes a first electrode on a surface of the micro light emitting element opposite from the light emitting surface and a second electrode on the light emitting surface side of the micro light emitting element.

7. The image display device according to claim 6, wherein the plurality of partition walls each include a part of wiring that is electrically connected to the second electrode.

8. The image display device according to claim 1, wherein a surface of a side wall of the transparent portion in the direction parallel to the light emitting surface is a surface that is inclined so as to open in the light emission direction.

9. The image display device according to claim 8, wherein the side wall of the transparent portion in the direction parallel to the light emitting surface is covered with a highly reflective metal film.

10. The image display device according to claim 1, wherein the plurality of micro light emitting elements are a plurality of quantum dot light emitting diodes each of which includes a quantum dot layer including a quantum dot and emits light when electricity is supplied to the quantum dot layer.

11. The image display device according to claim 1, wherein the plurality of micro light emitting elements are a plurality of organic light emitting diodes.

12. An image display device comprising:
   a plurality of micro light emitting elements arranged in an array shape;
   a driving circuit substrate including a driving circuit that supplies electric current to the plurality of micro light emitting elements and that causes the plurality of micro light emitting elements to emit light;
   a plurality of micro lenses in contact with light emitting surfaces of the plurality of micro light emitting elements; and
   a plurality of partition walls disposed around the plurality of micro lenses in a direction parallel to the light emitting surfaces,
   wherein a side surface of each of the plurality of partition walls facing a corresponding one of the plurality of micro lenses is inclined so as to open in a light emission direction and is a reflection surface that reflects light, and
   wherein each of the plurality of micro light emitting elements includes a micro light emitting diode including a compound semiconductor crystal and a wavelength conversion portion that increases a wavelength of excitation light emitted by the micro light emitting diode, and the light emitting surface is an upper surface of the wavelength conversion portion.

13. The image display device according to claim 12, wherein a surface of a side wall of the wavelength conversion portion in the direction parallel to the light emitting surface is a surface that is inclined so as to open in the light emission direction.

14. The image display device according to claim 13, wherein the side wall of the wavelength conversion portion in the direction parallel to the light emitting surface is covered with a highly reflective metal film.

15. The image display device according to claim 12, wherein the wavelength conversion portion is disposed inside of each of the plurality of partition walls, and the wavelength conversion portion and a corresponding one of the plurality of micro lenses are stacked in this order.

16. The image display device according to claim 15, wherein the reflection surface covers a periphery of the wavelength conversion portion in the direction parallel to the light emitting surface.

17. The image display device according to claim 12, wherein a plurality of dielectric multilayer films that reflect the excitation light and that transmit the light whose wavelength has been increased are disposed on light emitting surfaces of the plurality of micro lenses that emit light.

18. The image display device according to claim 12, wherein the plurality of micro lenses include a filter material that absorbs the excitation light and transmits the light whose wavelength has been increased.

19. An image display device comprising:
a plurality of micro light emitting elements arranged in an array shape;
a driving circuit substrate including a driving circuit that supplies electric currents to the plurality of micro light emitting elements and that causes the plurality of micro light emitting elements to emit light;
a plurality of wavelength conversion portions that increase wavelength of excitation light emitted by the plurality of micro light emitting elements; and
a plurality of partition walls disposed around the plurality of wavelength conversion portions in a direction parallel to light emitting surfaces of the plurality of micro light emitting elements,
wherein the driving circuit substrate, the plurality of micro light emitting elements, and the plurality of wavelength conversion portions are stacked in this order,
wherein the plurality of wavelength conversion portions each have a shape including a curved surface that is convex in a light emission direction, and
wherein a side surface of each of the plurality of partition walls facing a corresponding one of the plurality of wavelength conversion portions is inclined so as to open in the light emission direction and is a reflection surface that reflects light.

* * * * *